United States Patent
Ito et al.

(10) Patent No.: US 7,669,172 B2
(45) Date of Patent: Feb. 23, 2010

(54) PATTERN CREATION METHOD, MASK MANUFACTURING METHOD AND SEMICONDUCTOR DEVICE MANUFACTURING METHOD

(75) Inventors: Takeshi Ito, Yokkaichi (JP); Satoshi Tanaka, Kawasaki (JP); Toshiya Kotani, Machida (JP); Tadahito Fujisawa, Yokkaichi (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 12/050,764

(22) Filed: Mar. 18, 2008

(65) Prior Publication Data

US 2008/0235650 A1    Sep. 25, 2008

(30) Foreign Application Priority Data

Mar. 19, 2007    (JP)    ............................. 2007-071031

(51) Int. Cl.
    *G06F 17/50*    (2006.01)
(52) U.S. Cl. .............................. 716/19; 716/20; 716/21; 430/5; 430/14; 430/313
(58) Field of Classification Search .............. 716/19–21; 430/5, 14, 313
    See application file for complete search history.

(56) References Cited

U.S. PATENT DOCUMENTS

| 2006/0194429 | A1 | 8/2006 | Hashimoto et al. |
| 2007/0238053 | A1* | 10/2007 | Hashimoto .................. 430/313 |
| 2007/0261016 | A1* | 11/2007 | Sandhu et al. ................ 716/19 |
| 2008/0178141 | A1* | 7/2008 | Sato ........................... 716/19 |

FOREIGN PATENT DOCUMENTS

JP    2006-186104    7/2006

* cited by examiner

*Primary Examiner*—Naum B Levin
(74) *Attorney, Agent, or Firm*—Finnegan, Henderson, Farabow Garrett & Dunner, L.L.P.

(57) ABSTRACT

A pattern creation method, including laying out data of a most extreme end pattern of integrated circuit patterns on a first layer and laying out data of the integrated circuit patterns excluding the most extreme end pattern on a second layer, extracting data of a first most proximate pattern being most proximate to the most extreme end pattern from the second layer and converting the extracted data to a third layer, generating data of a contacting pattern which contacts both the first most proximate pattern and the most extreme end pattern in a fourth layer, generating data of a non-overlapping pattern of the contacting pattern excluding overlapping portions with the most extreme end pattern and the first most proximate pattern in a fifth layer, extracting data of a second most proximate pattern being most proximate to the non-overlapping pattern and converting the extracted data to the first layer.

20 Claims, 24 Drawing Sheets

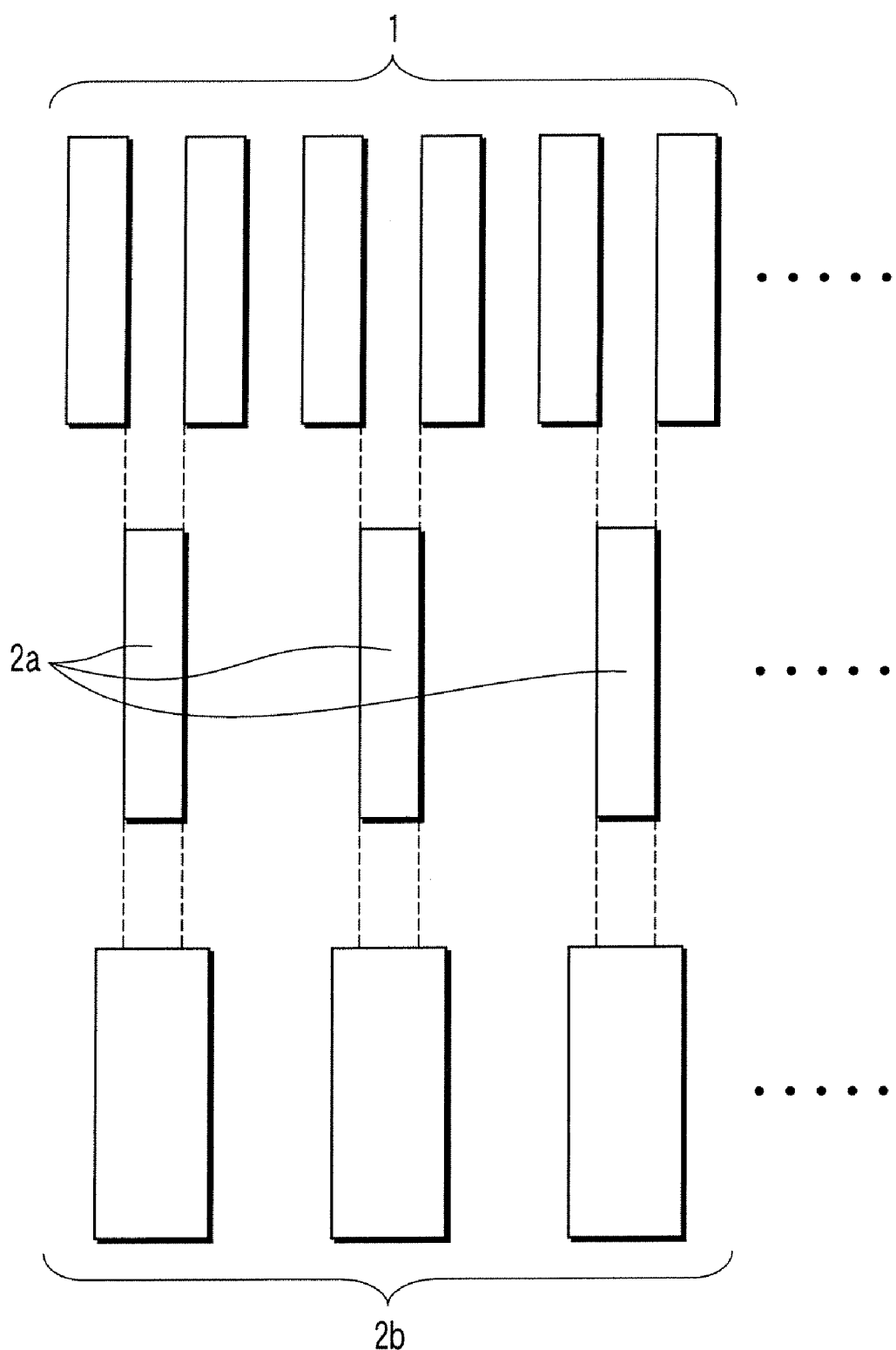
F I G. 1

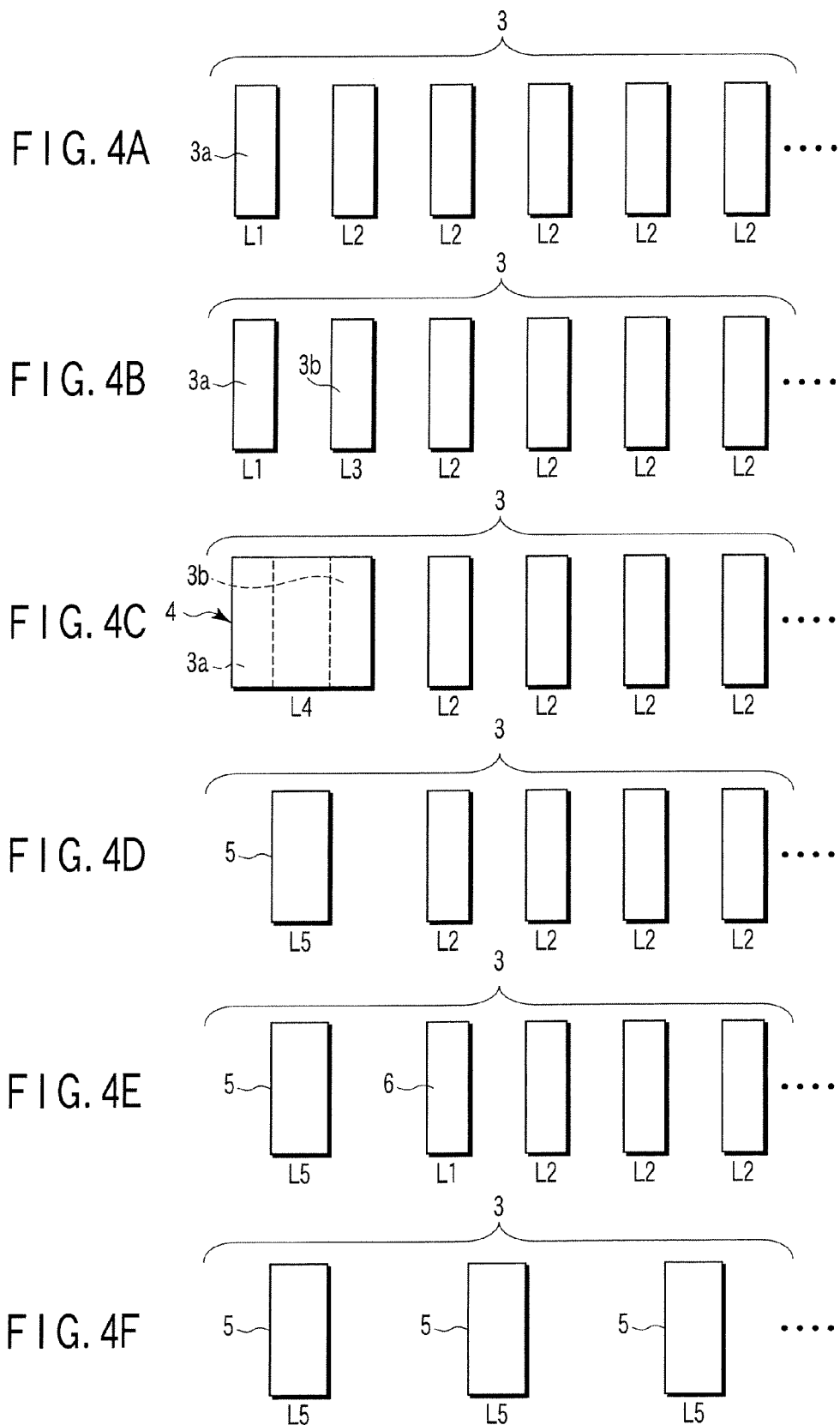

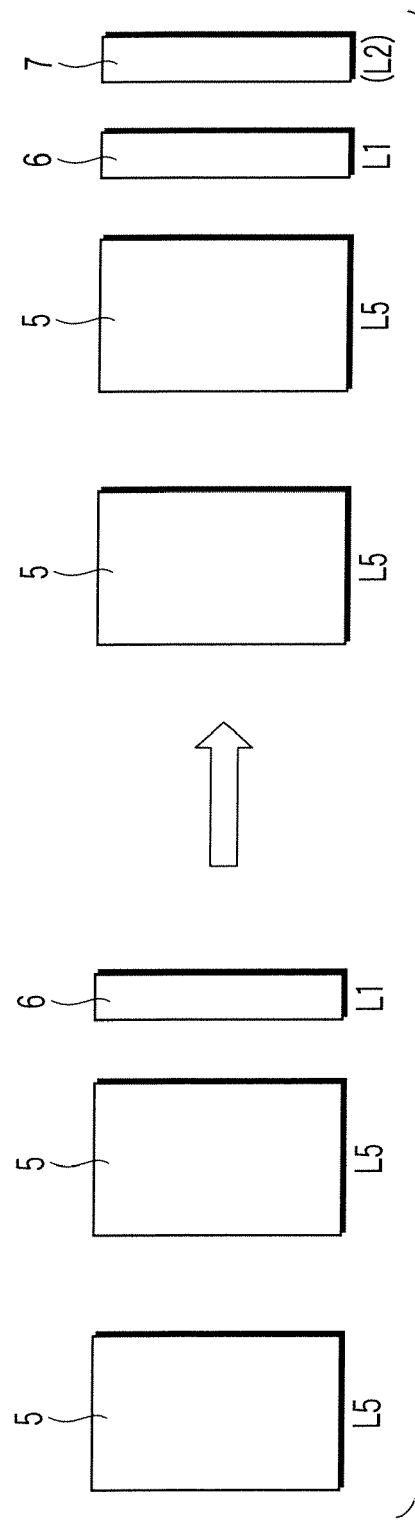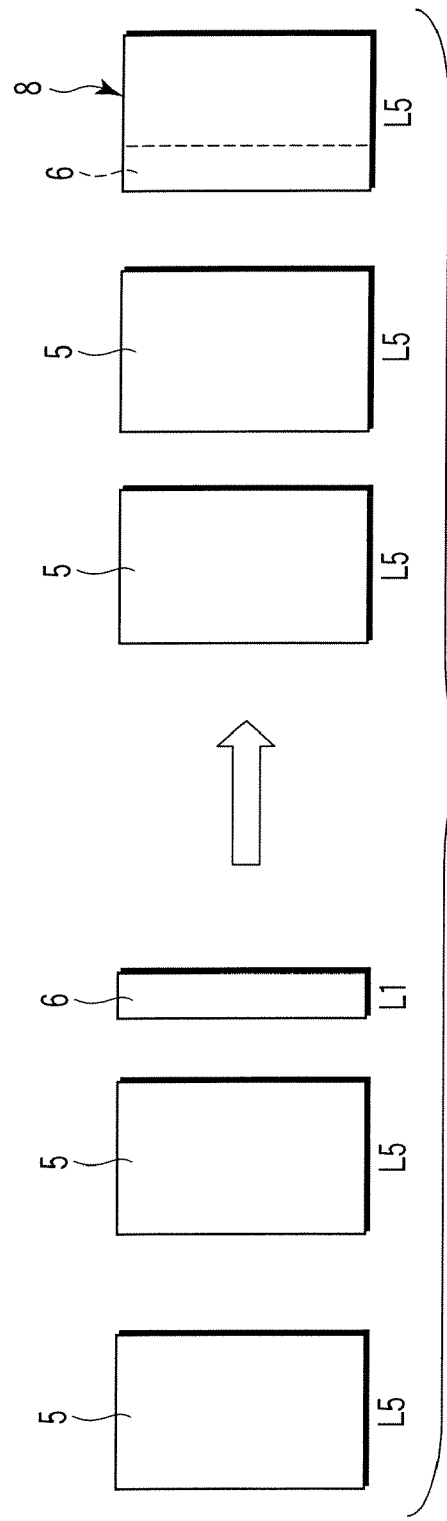

PATTERN CREATION METHOD, MASK MANUFACTURING METHOD AND SEMICONDUCTOR DEVICE MANUFACTURING METHOD

CROSS-REFERENCE TO RELATED APPLICATIONS

This application is based upon and claims the benefit of priority from prior Japanese Patent Application No. 2007-071031, filed Mar. 19, 2007, the entire contents of which are incorporated herein by reference.

BACKGROUND OF THE INVENTION

1. Field of the Invention

The present invention relates to a manufacturing technology of semiconductor device, and particularly to a pattern creation method and pattern creation program applicable for lithography process to be carried out using technology called sidewall leaving process, and a mask manufacturing method and a semiconductor device manufacturing method.

2. Description of the Related Art

In recent years, miniaturization and intensified integration of various kinds of semiconductor devices such as LSIs have progressed remarkably. Accompanied by this, the minimum size necessary for a semiconductor circuit pattern has been approaching the same size as a resolution limit size obtained by current lithography technology. Particularly, in an updated development circuit pattern, sometimes, that minimum size has been lower than the current resolution limit size. To meet such a circumstance, applications of various processes for improving the resolution have been proposed.

For example, as a method for forming a miniaturized gate pattern in a logic device such as an ASIC, the following methods are generally well known. According to a first method, using a Levenson phase shift mask including an opening portion such that the phase of passing light is 0° to 180° across a portion corresponding to a gate portion, a dark portion corresponding to the gate portion is produced so as to form a positive resist pattern thereby forming a miniaturized line. According to a second method (resist trimming), by applying slimming process to a resist pattern after lithography process, the gate length at the finishing stage is reduced. According to a third method (hard mask slimming), by transferring a resist pattern to a hard mask after lithography process, the hard mask is slimmed and after that, a gate pattern material is processed.

As a method for forming miniaturized holes, a method of, after a resist pattern is formed, applying heat treatment upon the resist film to induce plastic deformation in order to reduce the hole diameter (thermal flow process) is available. Further, there is also available a method of, after a resist pattern is formed, applying a coating material which mixes with resist resin by heat treatment on the resist pattern and then reducing space between specified patterns by using heating process (RELACS™ process).

However, in any method, the critical resolution pitch is limited by the specification of an optical system of an applied exposure device. That is, assuming that the exposure wavelength of the exposure device is $\lambda$ µm and numeric aperture of a projection optical system is NA, the critical resolution pitch Pcritical is Pcritical=$0.5 \times \lambda/NA$. In a semiconductor device which requires a high density repetitive pattern such as a memory device, the aforementioned critical resolution pitch limits the integration degree. However, in the field of flash memory devices which has recently progressed remarkably, the pattern has been required to be formed under dimensions exceeding the resolution limit value of optical lithography in order to achieve a large scale request from the market. That is, in the field of the flash memory device, the miniaturization based on conventional optical lithography technology cannot follow up requests from the market and thus, introduction of a novel miniaturization process is indispensable. Thus, to form an ultrafine pattern exceeding the resolution limit of the conventional optical lithography, some novel methods have been proposed, such as a method of disassembling a pattern to plural groups and repeating the exposure process and processing process several times, and a method of carrying out exposure several times using a two-photon absorption resist.

As one of the promising methods of these novel pattern forming processes, so-called sidewall leaving process is available. Then, this sidewall leaving process is largely classified into two kinds of processes, i.e., a line sidewall leaving process and a space sidewall leaving process. Hereinafter, a case of forming a pattern having a convex section like a gate layer by applying the line sidewall leaving process or space sidewall leaving process will be described briefly. First, a case of forming the pattern by the line sidewall leaving process will be described with reference to FIGS. 26A to 26E.

First, as shown in FIG. 26A, there is prepared a semiconductor substrate 101 in which a processing object film 103, which turns to an integrated circuit pattern later, a first hard mask material 104 as a sacrifice film and a resist film 105 are overlaid on a substrate main body 102 successively. Then, after a mask pattern 107 formed on a mask 106 is exposed and transferred to the resist film 105 by ordinary lithography process, the resist film 105 is developed. Consequently, a resist pattern 108 having the same shape as the mask pattern 107 is formed on the first hard mask 104. This resist pattern 108 is formed in a pattern formation area, which finally turns to a concave shape, adjacent to a desired position for forming a convex pattern.

Next, as shown in FIG. 26B, by etching the first hard mask with the resist pattern 108 as a mask, a first hard mask pattern 109 is formed on the processing object film 103. At this time, by applying the slimming process to the resist pattern 108 or the first hard mask pattern 109, the first hard mask pattern 109 is shaped to a pattern finer than the limit of the resolution of the lithography process. Subsequently, the resist film 105 on the first hard mask pattern 109 shaped into the fine pattern is peeled and removed. In the meantime, like the resist pattern 108, the first hard mask pattern 109 is formed in the concave pattern formation area.

Next, a film 110 which turns to a line sidewall pattern is deposited on the processing object film 103 by covering the first hard mask pattern 109. Subsequently, the film 110 is ground up to a substantially the same height as the first hard mask pattern 109 according to CMP method or the like and the film 110 is patterned according to the RIE method or the like. Consequently, as shown in FIG. 26C, a line sidewall pattern 110 is formed such that it surrounds the sidewall portion of the first hard mask pattern 109.

Next, by etching the line sidewall pattern 110 with a high etching resistance and the first hard mask pattern 109 with a low etching resistance, only the first hard mask pattern 109 on the processing object film 103 is removed. Consequently, as shown in FIG. 26D, only the desired line sidewall pattern 110 is left on the processing object film 103.

Next, the processing object film 103 as a fundamental film is etched with the line sidewall pattern 110 left on the processing object film 103 as a mask. Consequently, as shown in FIG. 26E, a desired integrated circuit pattern 111 is formed of the processing object film 103 on the main body 102 of the semiconductor substrate 101. After the integrated circuit pattern 111 is formed, the line sidewall pattern 110 on the processing object film 103 is peeled and removed. If the line sidewall leaving process is used, a gate electrode interconnect pattern 111 as an integrated circuit pattern having a convex shaped section can be formed on the substrate main body 102 through such a process. If the line sidewall leaving process is used, the sidewall pattern for the resist pattern to be formed in lithography process is a design pattern.

Next, a case of forming a pattern through the space sidewall leaving process will be described with reference to FIGS. 27A to 27F. In the meantime, like reference numerals are attached to the same components as the line sidewall leaving process and detailed description thereof is omitted.

Through the same process as the line sidewall leaving process, as shown in FIGS. 27A and 27B, the first hard mask pattern 109 finer than the limit of the resolution of the lithography process is formed on the processing object film 103.

Next, as shown in FIG. 27C, the line sidewall pattern 110 is formed such that it surrounds the first hard mask pattern 109 by the same process as the line sidewall leaving process.

Next, a second hard mask material 112 is deposited on the processing object film 103 by covering the first hard mask pattern 109 and the line sidewall pattern 110. Subsequently, the second hard mask material 112 is ground up to substantially the same height as the first hard mask pattern 109 and the line sidewall pattern 110 according to the CMP method or the like. Consequently, as shown in FIG. 27D, the second hard mask material 112 is buried into the space portion between the line sidewall patterns 110.

Next, by etching the first hard mask pattern 109 and the second hard mask material 112 with a high etching resistance and the line sidewall pattern 110 with a low etching resistance, only the line sidewall pattern 110 on the processing object film 103 is removed. Consequently, as shown in FIG. 27E, a hard mask pattern 113 is formed of the first hard mask pattern 109 and the second hard mask pattern 112. The second hard mask pattern 112 is called space sidewall pattern.

Next, with the hard mask pattern 113 left on the processing object film 103 as a mask, the processing object film 103 as a fundamental film is etched. Consequently, as shown in FIG. 27F, a desired integrated circuit pattern 114 is formed of the processing object film 103 on the main body 102 of the semiconductor substrate 101. After the integrated circuit pattern 114 is formed, the hard mask pattern 113 on the processing object film 103 is peeled and removed. If the space sidewall leaving process is used, a gate electrode interconnect pattern 114 as an integrated circuit pattern having a convex shaped section can be formed on the substrate main body 102 through such a process. If this space sidewall leaving process is adopted, space adjacent to the sidewall portion of the resist pattern formed in lithography process is a space for design pattern.

If the sidewall leaving process is used, necessarily the design pattern is different from the resist pattern formed in the lithography process regardless of the line sidewall leaving process or the space sidewall leaving process. That is, the mask pattern of the photomask for use in the sidewall leaving process is different from a pattern formed finally by the sidewall leaving process. Therefore, to execute the sidewall leaving process, after data of a desired resist pattern is created based on data of the design pattern, data of the resist pattern needs to be converted to data of the mask pattern of a photomask for use in the lithography process. However, such a method which can execute the data conversion rapidly and easily has not been reported.

The sidewall leaving process has such a fault that an unwanted portion is produced in an obtained pattern or a large-area pattern cannot be formed by a single process. For this reason, if the sidewall leaving process is used, after a fundamental pattern is formed, it is necessary to remove the unwanted portion using another mask different from the mask used for pattern formation or transfer a large-area pattern. Further, if an irregular pattern is formed by the sidewall leaving process, data of a pattern to be formed by the sidewall leaving process needs to be created by a device designer in order to create data for removal of surplus pattern. Thus, there occurs a problem in handling data. Further, a problem may occur in data to be created by the device designer.

Assume that a fine line and space pattern is formed into such a staircase configuration that the length of the line pattern is increased or decreased in order as it goes from one side to the other side. In this case, because a surplus pattern is always produced when the sidewall leaving process is adopted, mask exposure for removing that surplus pattern needs to be carried out after the sidewall leaving process. In this case, for the staircase-like line pattern, tolerance (Tol) of mismatch between surplus pattern removal exposure and sidewall pattern exposure needs to be set to a value smaller than the minimum line width of the line pattern. If this tolerance of mismatch is set to a larger value than half of the minimum line width of the line pattern, there is a possibility that a line pattern very much finer than the minimum line width of a desired line pattern may be formed on a wafer when the mismatch is produced. Then, such an extremely fine line pattern can become the cause of a fault.

As disclosed in, for example, Jpn. Pat. Appln. KOKAI Publication No. 2006-186104, the method for removing the surplus pattern using an oblique pattern has such an advantage that the tolerance of mismatch between the surplus pattern removal exposure and sidewall pattern exposure can be set to a value larger than half of the minimum line width of a desired line pattern. However, this method using the oblique pattern requires preliminary setting of oblique pattern data when data of a desired line pattern is designed. Thus, the method using the oblique pattern suffers from a large load for data handling as described above. Thus, in the case of the oblique pattern method, it is desired to remove the surplus pattern using the oblique pattern after tape out of pattern design data for actual applications.

BRIEF SUMMARY OF THE INVENTION

According to an aspect of the invention, there is provided a pattern creation method, comprising: laying out data of a most extreme end pattern located at the most extreme end of a plurality of integrated circuit patterns arranged in line on a processing object substrate on a first layer, and laying out data of the each integrated circuit pattern other than the most extreme end pattern on a second layer; extracting data of a first most proximate pattern which is most proximate to the most extreme end pattern of the each integrated circuit pattern except the most extreme end pattern from the second layer and converting data of the extracted first most proximate pattern from the second layer to a third layer; generating data of a contacting pattern which contacts both the first most proximate pattern whose data is converted to the third layer and the most extreme end pattern in a fourth layer; generating data of a non-overlapping pattern which is the contacting pattern whose data is generated in the fourth layer, excluding a portion which overlaps the most extreme end pattern and the first most proximate pattern whose data is converted to the third layer, in a fifth layer; extracting data of a second most proximate pattern which is most proximate to the non-overlapping pattern whose data is generated in the fifth layer of the each integrated circuit pattern whose data is laid out in the second layer and converting data of the extracted second most proximate pattern from the second layer to the first layer; and repeating from a step of extracting data of the first most proximate pattern from the second layer and converting the data to the third layer to a step of extracting data of the second most proximate pattern from the second layer and converting the data to the first layer with respect to all data of the each integrated circuit pattern.

According to another aspect of the invention, there is provided a mask manufacturing method for forming a mask pattern based on pattern data created using a pattern creation method on a mask, comprising: laying out data of a most extreme end pattern located at the most extreme end of a plurality of integrated circuit patterns arranged in line on a processing object substrate on a first layer, and laying out data of the each integrated circuit pattern other than the most extreme end pattern on a second layer; extracting data of a first most proximate pattern which is most proximate to the most extreme end pattern of the each integrated circuit pattern except the most extreme end pattern from the second layer and converting data of the extracted first most proximate pattern from the second layer to a third layer; generating data of a contacting pattern which contacts both the first most proximate pattern whose data is converted to the third layer and the most extreme end pattern in a fourth layer; generating data of a non-overlapping pattern which is the contacting pattern whose data is generated in the fourth layer, excluding a portion which overlaps the most extreme end pattern and the first most proximate pattern whose data is converted to the third layer, in a fifth layer; extracting data of a second most proximate pattern which is most proximate to the non-overlapping pattern whose data is generated in the fifth layer of the each integrated circuit pattern whose data is laid out in the second layer and converting data of the extracted second most proximate pattern from the second layer to the first layer; and repeating from a step of extracting data of the first most proximate pattern from the second layer and converting the data to the third layer to a step of extracting data of the second most proximate pattern from the second layer and converting the data to the first layer with respect to all data of the each integrated circuit pattern.

According to far another aspect of the invention, there is provided a semiconductor device manufacturing method for forming integrated circuit patterns on a semiconductor substrate using a mask substrate manufactured according to a mask manufacturing method for forming a mask pattern based on pattern data created using a pattern creation method on a mask, comprising: laying out data of a most extreme end pattern located at the most extreme end of a plurality of integrated circuit patterns arranged in line on a processing object substrate on a first layer, and laying out data of the each integrated circuit pattern other than the most extreme end pattern on a second layer; extracting data of a first most proximate pattern which is most proximate to the most extreme end pattern of the each integrated circuit pattern except the most extreme end pattern from the second layer and converting data of the extracted first most proximate pattern from the second layer to a third layer; generating data of a contacting pattern which contacts both the first most proximate pattern whose data is converted to the third layer and the most extreme end pattern in a fourth layer; generating data of a non-overlapping pattern which is the contacting pattern whose data is generated in the fourth layer, excluding a portion which overlaps the most extreme end pattern and the first most proximate pattern whose data is converted to the third layer, in a fifth layer; extracting data of a second most proximate pattern which is most proximate to the non-overlapping pattern whose data is generated in the fifth layer of the each integrated circuit pattern whose data is laid out in the second layer and converting data of the extracted second most proximate pattern from the second layer to the first layer; and repeating from a step of extracting data of the first most proximate pattern from the second layer and converting the data to the third layer to a step of extracting data of the second most proximate pattern from the second layer and converting the data to the first layer with respect to all data of the each integrated circuit pattern.

BRIEF DESCRIPTION OF THE SEVERAL VIEWS OF THE DRAWING

FIG. 1 is a plan view showing the correspondence relation of patterns in the sidewall leaving process;

FIGS. 4A, 4B, 4C, 4D, 4E and 4F are plan views showing each of patterns formed by the pattern creation method according to the first embodiment;

FIGS. 5A and 5B are plan views showing a pattern creation process in the pattern creation method according to the first embodiment;

DETAILED DESCRIPTION OF THE INVENTION

Figure 2:
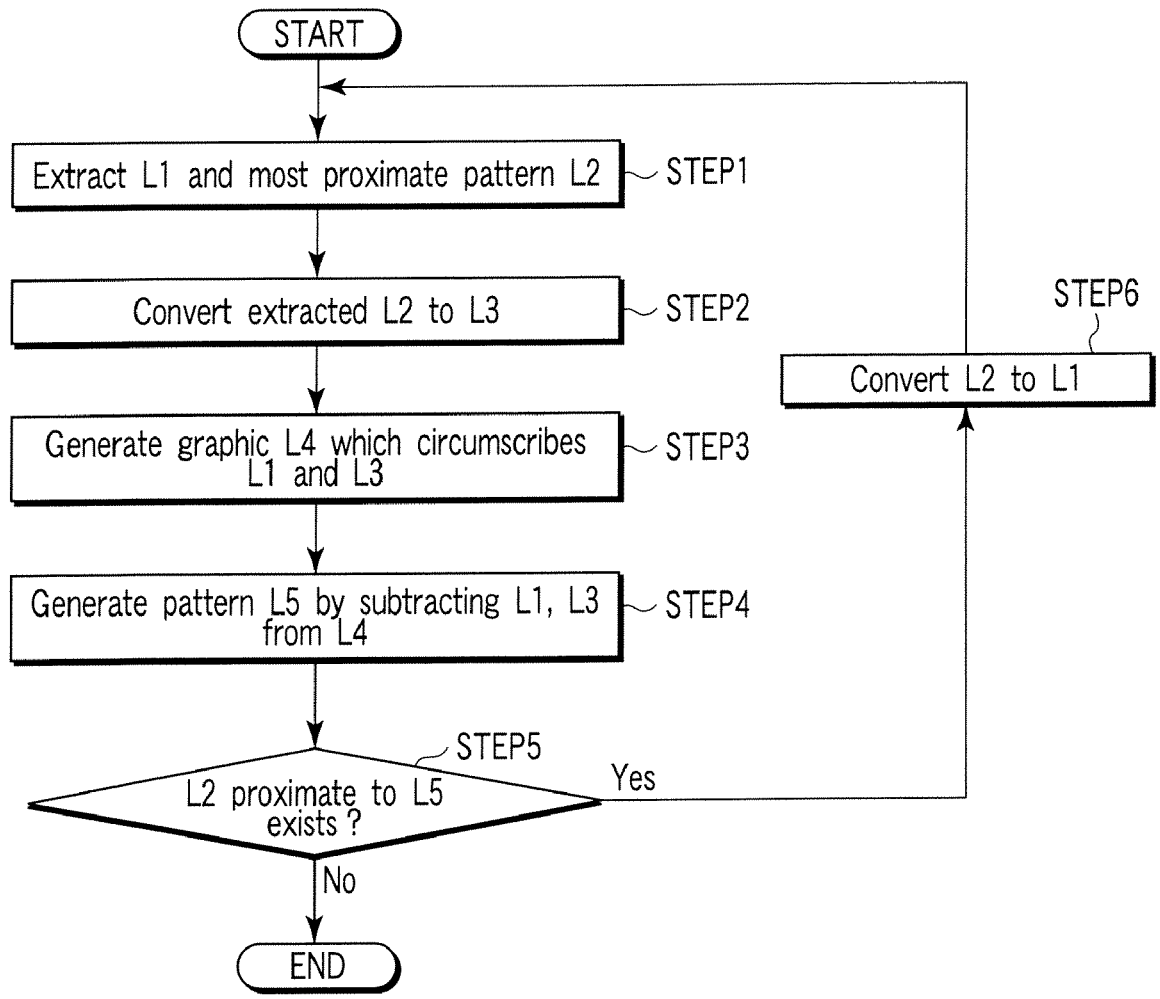
FIG. 2 is a flow chart showing a pattern creation method according to a first embodiment.

Hereinafter, embodiments of the present invention will be described in detail with reference to the accompanying drawings.

FIRST EMBODIMENT

First, a first embodiment of the present invention will be described with reference to FIGS. 1 to 6.

In this embodiment, there will be described a lithography mask data processing method for creating lithography mask data effectively and easily in lithography process for forming a pattern using the line sidewall leaving process in the sidewall leaving process which is largely classified into the line sidewall leaving process and space sidewall leaving process. If the line sidewall leaving process is used, a sidewall pattern of a resist pattern formed in actual lithography process is adopted as a pattern at design stage. That is, in the line sidewall leaving process, generally, the design pattern and resist pattern are different from each other.

Assume that a design pattern 1 composed of the size, shape and arrangement shown on an upper level of FIG. 1 is designed. Then, a resist pattern 2a formed using the line sidewall leaving process based on this design pattern 1 has a size, shape and arrangement shown on an intermediate level of FIG. 1. Alternatively, a resist pattern 2b formed considering that it is to be ground in slimming process after the resist pattern is formed has a shape obtained by thickening the resist pattern 2a by an amount to be ground in the slimming process as shown in the lower level of FIG. 1. Therefore, if the line sidewall leaving process is used, to create data of a desired integrated circuit pattern, it is necessary to convert data of the resist patterns 2a, 2b to data of a pattern of the lithography photomask (not shown) after the data of the resist patterns 2a, 2b are formed based on data of the design pattern 1. However, any method capable of performing such data conversion easily has not yet been reported.

Thus, this embodiment provides a pattern creation technology adopting a verification method for the integrated circuit pattern using shape measuring technology. That is, in this embodiment, there will be described a technology for creating data of a mask pattern effectively and easily by devising data conversion upon creation of data of the mask pattern which turns to a desired integrated circuit pattern from data of the resist pattern 2a. First, the pattern creation method according to this embodiment will be described with reference to FIGS. 2 and 4A to 6.

First, as shown in FIG. 4A, on a design layout stage of integrated circuit patterns 3 to be formed such that they are arranged on a semiconductor substrate as a processing object substrate (not shown), data of a pattern 3a located on the most extreme end of each integrated circuit pattern 3 is laid on a first layer as L1. At the same time, data of the integrated circuit pattern 3 except the most extreme end pattern 3a is laid on a second layer as L2.

Next, as shown in FIG. 4B, data of a first most proximate pattern 3b which is most proximate to the most extreme end pattern 3a in the integrated circuit patterns 3 except the extreme end pattern 3a is extracted from the second layer. This process is indicated as STEP 1 in FIG. 2. Subsequently, data of this extracted first most proximate pattern 3b is converted from the second layer to a third layer to obtain L3. This process is indicated as STEP 2 in FIG. 2.

Next, as shown in FIG. 4C, data of a contacting pattern (an including pattern) 4 in contact with (includes) both the most extreme end pattern 3a and the first most proximate pattern 3b is produced in a fourth layer as L4. This process is indicated as STEP 3 in FIG. 2.

Next, as shown in FIG. 4D, data of a pattern 5 which is the contacting pattern (the including pattern) 4 excluding portions overlapping the most extreme end pattern 3a and the first most proximate pattern 3b is produced in a fifth layer as L5. A non-overlapping pattern 5 corresponding to this data L5 turns to a desired resist pattern. This process is indicated as STEP 4 in FIG. 2.

Next, as indicated as STEP 5 in FIG. 2, it is determined whether or not a second pattern 6 most proximate to the non-overlapping pattern 5 exists in the integrated circuit pattern 3 in which data is laid on the second layer as L2. If the second most proximate pattern 6 which is most proximate to the non-overlapping pattern 5 exists, as shown in FIG. 4E, the data L2 of the second most proximate pattern 6 is extracted from the data L2 of the integrated circuit pattern 3 laid on the second layer. Then, the data L2 of the extracted second most proximate pattern 6 is converted from the second layer to the first layer as L1. This process is indicated as STEP 6 in FIG. 2.

After that, the respective steps from STEPS 1 to 6 described above are carried out repeatedly until they are executed to all data L2 of the integrated circuit pattern 3 as indicated with an arrow directed from STEP 6 to STEP 1 in FIG. 2. In this case, in step 1 of each cycle, the second most proximate pattern 6 in which the data L1 is converted to the first layer is regarded as the most extreme end pattern 3a.

Assume that, in STEP 6 described above, as indicated in the left side of the arrow in FIGS. 5A and 5B, although the second most proximate pattern 6 whose data L1 is converted to the first layer exists, data L2 of the integrated circuit pattern 3 adjacent to the second most proximate pattern 6 is vanished from the second layer. As a first countermeasure of this case, for example, as shown in the right side of the arrow in FIG. 5A, data of a dummy pattern 7 of the integrated circuit pattern 3 is generated in the second layer in a pseudo way as L2 such that it is adjacent to the second most proximate pattern 6. After that, the above-mentioned STEPS 2 to 4 are executed so as to generate data of the non-overlapping pattern 5 as L5 in the fifth layer. Alternatively, as a second countermeasure, for example, as shown in the right side of the arrow of FIG. 5B, the second most proximate pattern 6 is resized so that the second most proximate pattern 6 is of the same size and shape as the non-overlapping pattern 5 on an opposite side to the non-overlapping pattern 5 proximate thereto. Data L1 of the resized second most proximate pattern 8 is generated in the fifth layer as L5.

Figure 6:
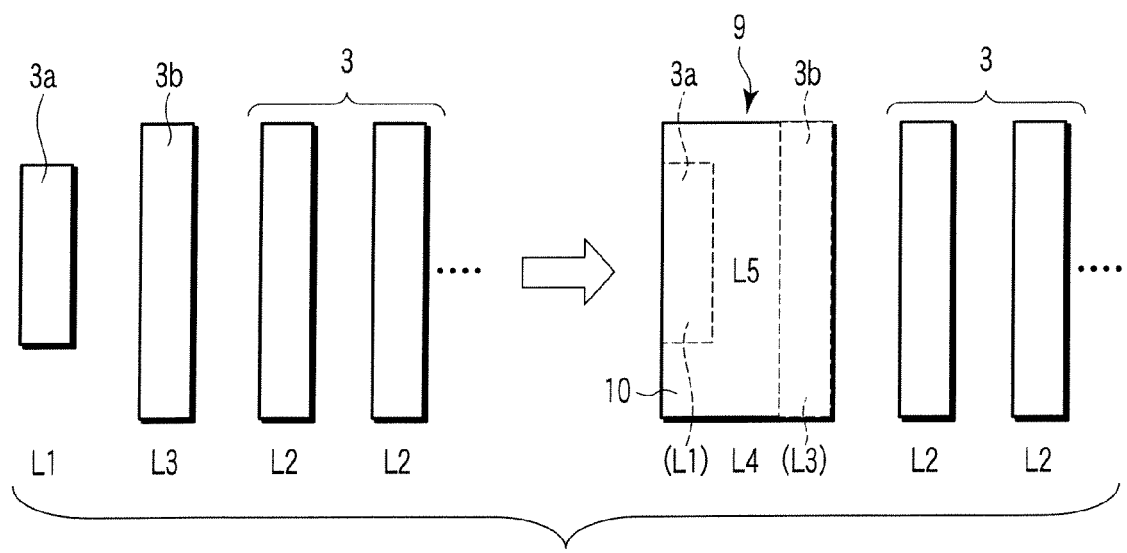
FIG. 6 is a plan view showing the pattern creation process in the pattern creation method according to the first embodiment.

Further, in the STEP 4, assume that as shown in the left side of the arrow in FIG. 6, when STEP 3 for producing a contacting pattern (an including pattern) is executed, the position and length of the end portion differ between the most extreme end pattern 3a in which the data L1 is laid on the first layer and the first most proximate pattern 3b in which the data L3 is laid out on the third layer. In this case, as shown in the right side of the arrow in FIG. 6, data of a pattern 9 which contains all the first most proximate pattern 3b which is a larger graphic while contacting (including) both the most extreme end pattern 3a and the first most proximate pattern 3b is produced in the fourth layer as L4. As shown in the right side of the arrow in FIG. 6, data L5 of a pattern 10 which is the contacting pattern (the including pattern) 9 excluding an overlapping portion which overlaps the most extreme end pattern 3a and the first most proximate pattern 3b is produced in the fifth layer. The non-overlapping pattern 10 corresponding to this data L5 turns to a desired resist pattern.

The above-described STEPS 1 to 6 are implemented to all the data L2 of the integrated circuit pattern 3 laid on the second layer. When all the data L2 of the integrated circuit pattern 3 are vanished, the pattern creation method of this embodiment is terminated. As a result, as shown in FIG. 4F, lithography target data composed of only data L5 of the plural non-overlapping patterns 5 laid on the fifth layer is generated. Each non-overlapping pattern 5 turns to a desired resist pattern to be formed in lithography process before the line sidewall pattern is formed on the non-overlapping pattern 5. By performing a predetermined correction such as optical proximity correction on the data L5 of the resist pattern composed of the non-overlapping pattern 5, the desired mask pattern data can be created.

The pattern creating device 11 and the pattern creation program of this embodiment will be described with reference to FIG. 3. The pattern creating device 11 of this embodiment is used to execute the aforementioned pattern creation method. The pattern creation program of this embodiment executes the pattern creation method by operating the pattern creating device 11.

Figure 3:
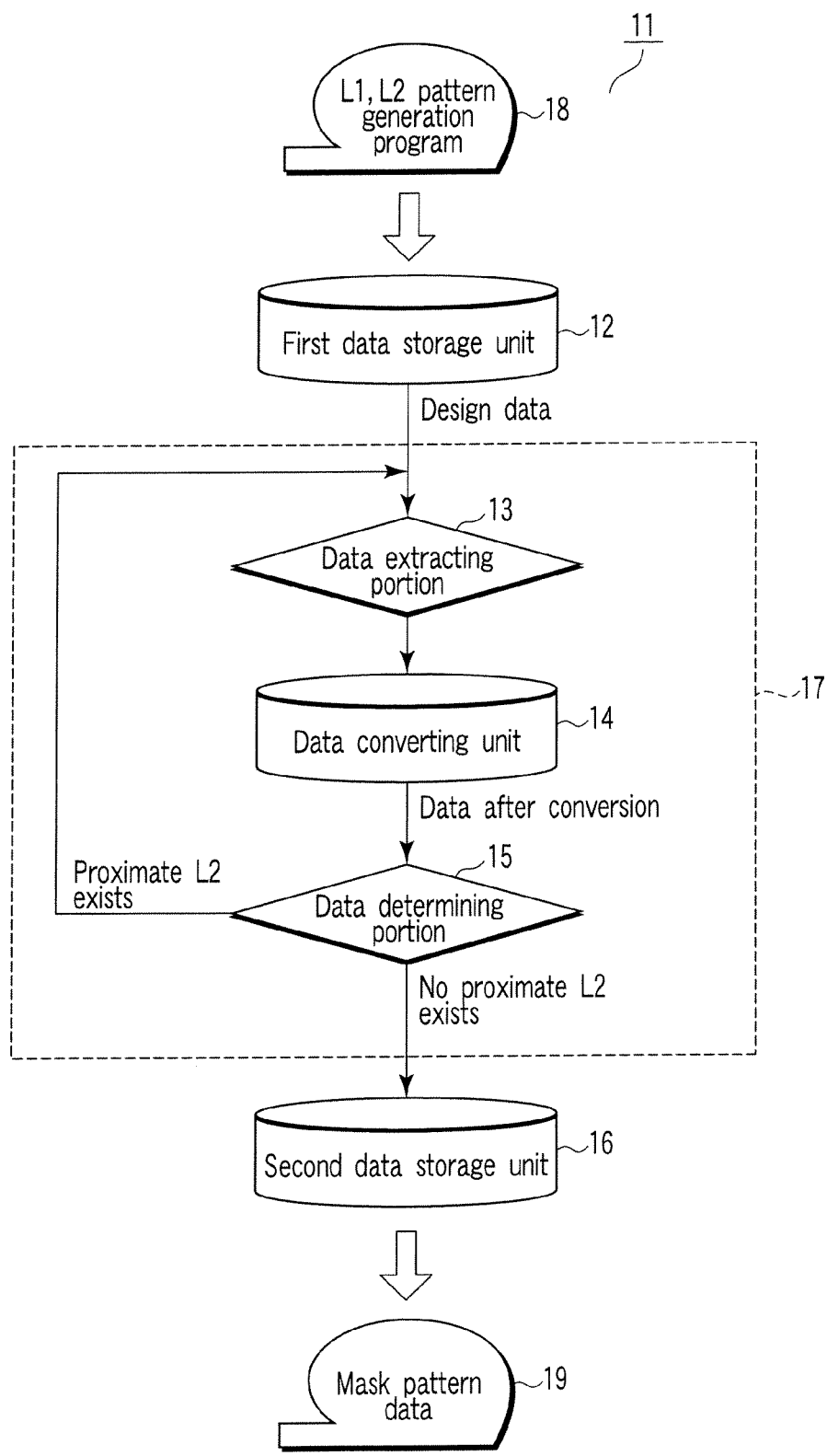
FIG. 3 is a block diagram showing schematically a pattern creating device according to the first embodiment.

First, the pattern creating device 11 as a computer is constituted of a first data storage unit 12, a data extracting portion 13, a data converting unit 14, a data determining portion 15 and a second data storage unit 16 as shown in FIG. 3. The first data storage unit 12 as a storage portion functions as an input portion of the pattern creating device 11. The data extracting portion 13, data converting unit 14 and data determining portion 15 constitute part of an arithmetic operation portion 17 serving as CPU, of the pattern creating device 11. Like the first data storage unit 12, the second data storage unit 16 as a storage portion functions as an output portion of the pattern creating device 11.

The first data storage unit 12 is constituted of, for example, a hard disk. Then, data L1, L2 of all the integrated circuit patterns 3 on design stage indicated in FIG. 4A including the most extreme end pattern 3a are input and stored in the first data storage unit 12. Further, a pattern creation program of this embodiment is input and stored in the first data storage unit 12. Usually, these data L1, L2 and the pattern creation program are recorded in, for example, a magnetic disk or optical disk or an input recording medium 18 such as a semiconductor memory. Thus, when the input recording medium 18 is loaded on an input unit (not shown) possessed by the pattern creating device 11, the data L1, L2 and pattern creation program recorded in the input recording medium 18 are input into the first data storage unit 12 which serves as an input portion of the pattern creating device 11. Then, the pattern creation program stored in the first data storage unit 12 is read out from the first data storage unit 12 by the arithmetic operating portion 17 as required so as to operate the pattern creating device 11 to execute the pattern creation method.

The pattern creation program lays out data of the most extreme end pattern 3a in the integrated circuit pattern 3 on the first layer by the arithmetic operating portion 17. At the same time, data of the integrated circuit pattern 3 except the most extreme end pattern 3a is laid out to the second layer as L2. Next, the pattern creation program makes the data extracting portion 13 of the arithmetic operating portion 17 execute step 1 of extracting data of the first pattern 3b which is most proximate to the most extreme end pattern 3a in the integrated circuit pattern 3 from the second layer. Subsequently, the pattern creation program makes the data converting unit 14 of the arithmetic operating portion 17 execute step 2 of converting data of the extracted first most proximate pattern 3b from the second layer to the third layer to obtain L3. Next, the pattern creation program makes the arithmetic operating portion 17 execute step 3 of generating data of the contacting pattern (including pattern) 4 which is in contact with (includes) both the most extreme end pattern 3a and the first most proximate pattern 3b in the fourth layer as L4. Next, the pattern creating program makes the arithmetic operating portion 17 execute step 4 of generating, in the fifth layer, data L5 of the non-overlapping pattern 5 which is the contacting pattern 4 excluding portions overlapping the most extreme end pattern 3a and the first most proximate pattern 3b.

Next, the pattern creation program makes the data determining portion 15 of the arithmetic operating portion 17 execute step 5 of determining whether or not the second most proximate pattern 6 which is most proximate to the non-overlapping pattern 5 exists in the integrated circuit pattern 3 in which data L2 is laid out on the second layer. If it is determined that the second pattern 6 which is most proximate to the non-overlapping pattern 5 exists by the data determining portion 15, as shown in FIG. 3, the pattern creation program makes the data extracting portion 13 of the arithmetic operating portion 17 execute a process of extracting data L2 of the second most proximate pattern 6 from data L2 of the integrated circuit pattern 3 laid out on the second layer. Then, the pattern creation program makes the data converting unit 14 of the arithmetic operating portion 17 execute step 6 of converting data L2 of the extracted second most proximate pattern 6 from the second layer to the first layer as L1.

After that, the pattern creation program makes the pattern creating device 11 execute respective steps from the step 1 to the step 6 repeatedly until they are performed on all the data L2 of the integrated circuit pattern 3. Consequently, as shown in FIG. 4F, lithography target data composed of only data L5 of plural non-overlapping patterns 5 laid out on the fifth layer is generated. The data L5 of the non-overlapping pattern 5 is input from the arithmetic operating portion 17 to the second data storage unit 16 and stored therein. Data L5 of each non-overlapping pattern 5 stored in the second data storage unit 16 turns to a desired resist pattern data formed in lithography process before the sidewall pattern is formed on the non-overlapping pattern 5. The pattern creation program subjects the data L5 of the resist pattern composed of the non-overlapping patterns 5 to a predetermined correction such as optical proximity correction by the arithmetic operating portion 17. In this manner, the desired mask pattern data is created.

After that, data of the created mask pattern is output out of the pattern creating device 11 through an output unit (not shown) possessed by the pattern creating device 11 from the second data storage unit 16 which serves as an output portion of the pattern creating device 11. For example, the mask pattern data is recorded in an output recording medium 19. After data of the mask pattern is output, the pattern creation program stops the pattern creating device 11 so as to terminate the pattern creation method of this embodiment. Note that, the pattern creating device 11 is called pattern creation system.

In the meantime, data L1, L2 and the pattern creation program as the input data do not always need to be stored in the input recording medium 18. Although not shown, the data L1, L2 and pattern creation program may be configured to be downloaded in the first data storage unit 12 as required through various communication networks such as the Internet or a LAN and an input device such as a network interface. In this case, the data L1, L2 and the pattern creation program only may be stored in various kinds of external computers or storage devices connected to the pattern creating device 11 through the various communication networks. Further, the data L1, L2 and the pattern creation program need to be stored in a computer or the pattern creating device 11 in a readable state or an executable state regardless of its recording state or recording style. As the input recording medium 18 for recording the data L1, L2 and the pattern creation program, a magnetic disk such as a flexible disk and hard disk, an optical disk such as CD, DVD and MO or a semiconductor memory or the like may be used. The same thing can be said of the mask pattern data as output data and the output recording medium 19 in which the mask pattern is to be recorded.

The first and second data storage units 12, 16 are not limited to the above-mentioned hard disk. As the first and second data storage units 12, 16, for example, the magnetic disk such as the flexible disk, the optical disk such as CD, DVD and MO, the semiconductor memory or a recording medium or recording unit in which data or program can be rewritten appropriately may be used. Further, the communication network may be wired or wireless.

According to the first embodiment, as shown above, if the integrated circuit pattern is formed using the sidewall leaving process, conversion from data of design pattern to data of the photomask pattern, which is difficult conventionally, can be carried out easily. Thus, according to this embodiment, fine pattern can be created effectively and easily by adopting the sidewall leaving process.

SECOND EMBODIMENT

Figure 7:
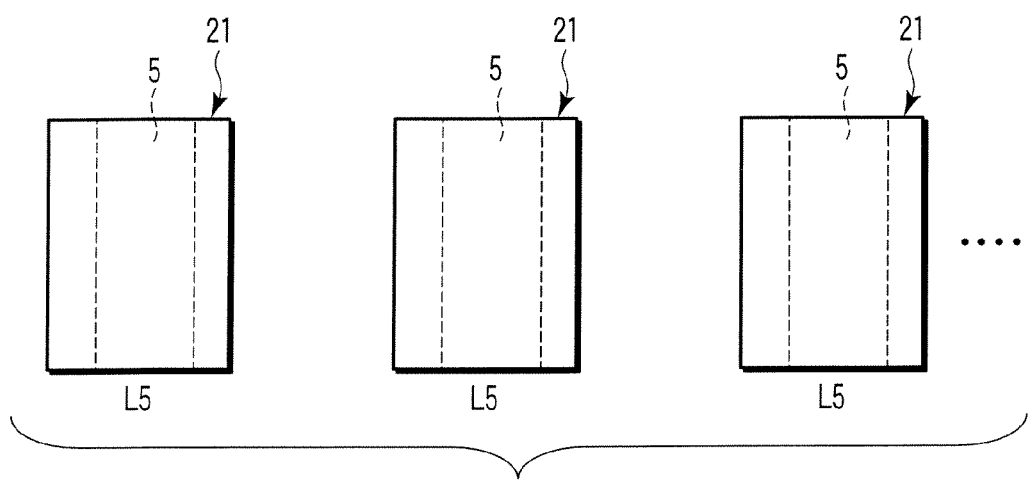
FIG. 7 is a plan view showing a pattern creation process in a pattern creation method according to a second embodiment.

Next, a second embodiment of the present invention will be described with reference to FIG. 7. Like reference numerals are attached to the same components as the first embodiment and detailed description thereof is omitted.

In this embodiment, there will be described a method for creating data of the resist pattern 2b by considering the slimming of the resist pattern not considered in the first embodiment and then creating data of a pattern of lithography photomask based on that resist pattern data effectively and easily.

First, like the first embodiment, the respective steps described with reference to FIGS. 2 to 6 are executed. Consequently, lithography target data composed of only data L5 of plural non-overlapping patterns 5 based on all data L1, L2 of the integrated circuit pattern 3 is generated. However, the non-overlapping pattern 5 produced by this process is a line-and-space pattern of about 1:3 in which the width of a space portion is about 3 when the width of a line portion is 1 as shown in FIG. 4F. If it is attempted to form a resist pattern by only lithography process based on the line-and-space pattern composed of such a shape and arrangement, there is a risk that the exposure margin is short.

According to this embodiment, to secure a sufficient exposure margin in the lithography process, a predetermined bias amount is applied to the data L5 of each non-overlapping pattern 5. More specifically, as shown in FIG. 7, the data L5 of each non-overlapping pattern 5 is resized so as to obtain a line-and-space pattern in which the width of the line portion and the width of the space portion is in a relation of about 1:1. In this case, the width of the line portion and the width of the space portion do not always need to be set to 1:1. The width of the space portion with respect to the width of the line portion is only required to be in the range of 1:1±20%.

Each resist pattern 21 formed by lithography process based on such setting is a larger pattern than the resist pattern 5 of the first embodiment before sidewall pattern shown in FIG. 4F is attached. However, by performing resist slimming processing on the resist pattern 21 in post process, it can be corrected to a size as large as the resist pattern 5 of the first embodiment before the sidewall pattern is attached.

In this embodiment, as in the first embodiment, a predetermined correction such as optical proximity correction is implemented on the data L5 of the non-overlapping pattern 21 as resist patter data resized to a line-and-space pattern in which the width of the line portion and the width of the space portion is in a relation of about 1:1. Consequently, data of the pattern 21 of the lithography photomask considering the slimming process can be produced.

According to the second embodiment, as described previously, even when data of the pattern 21 of the lithography photomask considering the slimming process is created, conversion from data of design pattern to data of the photomask pattern can be carried out rapidly and easily like the first embodiment. Thus, according to this embodiment, if the slimming process is considered, fine pattern to be formed by adopting the line sidewall leaving process can be created effectively and easily.

The pattern creation method of the second embodiment can be executed by operating the pattern creating device 11 according to the pattern creation program like the first embodiment. The pattern creation program of this embodiment is different from the pattern creation program of the first embodiment only in that it contains a step of making the data converting unit 14 of the arithmetic operating portion 17 possessed by the pattern creating device 11 execute data conversion process of resizing the non-overlapping pattern 5 to the non-overlapping pattern 21.

THIRD EMBODIMENT

Next, a third embodiment of the present invention will be described with reference to FIGS. 11 to 16B. In the meantime, like reference numerals are attached to the same components as the first and second embodiment and detailed description thereof is omitted.

In this embodiment also, a method for creating data of the mask pattern for a resist pattern creation exposure mask for use in semiconductor device manufacturing process using the line sidewall leaving process will be described like the first and second embodiments. More specifically, a method for creating data of a trimming pattern for removing surplus pattern left when the resist pattern is formed by multi-exposure effectively and easily will be described.

Prior to description of the pattern creation method of this embodiment, a general pattern creation method using the line sidewall leaving process will be described by referring to FIGS. 8A to 10B. As the integrated circuit pattern, here, the fine line-and-space pattern is formed. At the same time, the integrated circuit pattern is formed into a staircase shape which is extended or contracted as it goes from one side to the other side along a direction of arranging the line portions.

Figure 8A:
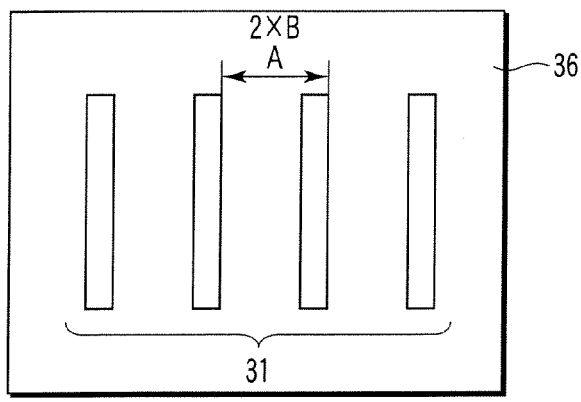
FIGS. 8A, 8B, 8C, and 8D are plan views showing schematically the pattern creation process using ordinary sidewall leaving process.
Figure 8B:
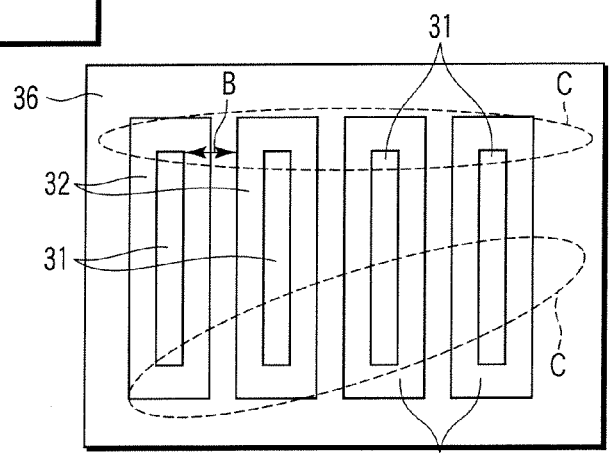

As shown in FIG. 8A, plural basic patterns 31 are formed as the fundamental of the integrated circuit pattern by arranging them on a semiconductor substrate 36 as a processing object substrate. The respective basic patterns 31 are formed such that an interval between the basic patterns 31 adjacent to each other indicated with an arrow A in FIG. 8A is set to twice an interval B described later. Subsequently, as shown in FIG. 8B, a sidewall pattern 32 surrounding the sidewall portion of the basic pattern 31 is formed. Here, the interval between the basic pattern 31 and the sidewall pattern 32 surrounding the adjacent basic pattern 31 indicated with an arrow B in FIG. 8B is defined to be 1 pitch. To form the integrated circuit pattern in the aforementioned staircase shape and leave it on the semiconductor substrate 36, the basic pattern 31 and the sidewall pattern 32 need to be formed into the staircase shape corresponding to the shape of the integrated circuit pattern. Thus, a portion C surrounded by dotted line in FIG. 8B of the basic patterns 31 and the sidewall patterns 32 becomes unnecessary. Thus, a trimming pattern for removing the surplus patterns which is the unwanted portion C of the basic patterns 31 and the sidewall patterns 32 is formed in next step.

Figure 8C:
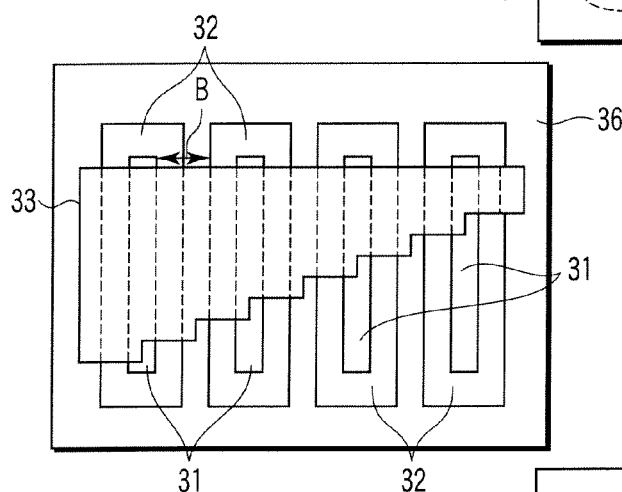
Figure 8D:
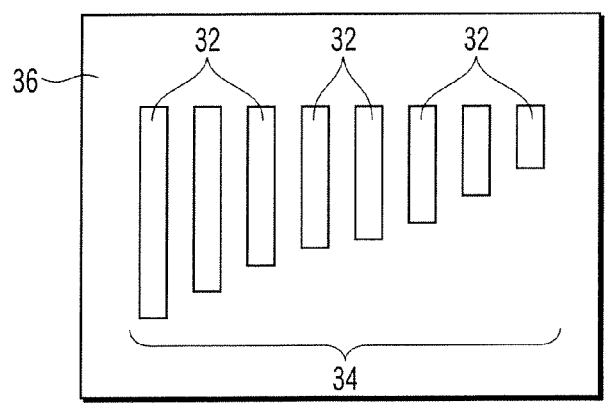

Next, as shown in FIG. 8C, a trimming pattern 33 for removing the unwanted portion C of the basic pattern 31 and the sidewall pattern 32 is formed. The trimming pattern 33 is formed into a staircase shape as a cover pattern for covering the basic patterns 31 and the sidewall patterns 32 left on the semiconductor substrate 36. Naturally, the trimming pattern 33 is formed partly into the staircase shape corresponding to the staircase shape of the basic patterns 31 and the sidewall patterns 32. Subsequently, the unwanted portion C of the basic patterns 31 and the sidewall patterns 32 exposed from the trimming pattern 33 is removed by etching. Subsequently, the trimming pattern 33 is removed by etching from the basic patterns 31 and the sidewall patterns 32 left on the semiconductor substrate 36. After that, the basic pattern 31 is removed from the semiconductor substrate 36 by etching from the basic pattern 31 and the sidewall pattern 32 left on the semiconductor substrate 36. Consequently, as shown in FIG. 8D, an integrated circuit pattern 34 composed of plural sidewall patterns 32 is formed in a desired staircase shape on the semiconductor substrate 36.

When the integrated circuit pattern 34 is formed as a fine line-and-space pattern composed of the staircase configuration by adopting the line sidewall leaving process, the surplus pattern is always produced. Thus, the trimming pattern 33 for removing the surplus pattern needs to be created as described above. Accompanied by this, mask exposure using the trimming pattern 33 needs to be carried out. Generally to obtain the integrated circuit pattern 34 of a desired shape by removing the surplus pattern appropriately, the tolerance (Tol) of mismatch between the sidewall pattern formation exposure as a first PEP and surplus pattern removal exposure as second PEP needs to be set to below half the minimum line width of the sidewall pattern 32.

Figure 9A:
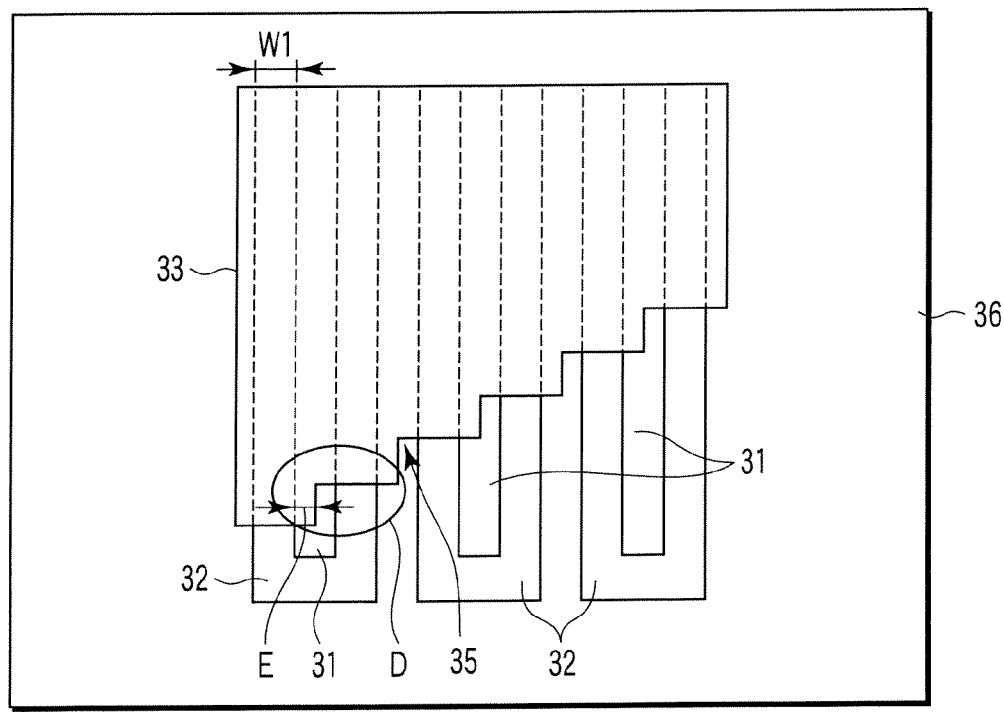
FIGS. 9A and 9B are plan views showing mismatch in the pattern creation process shown in FIGS. 8A to 8D.

FIG. 9A indicates an example of the mismatch tolerance (Tol). More specifically, as shown in FIG. 9A, the minimum line width of the line sidewall pattern 32 is assumed to be W1. Then, attention is paid to a portion D surrounded by a solid line in FIG. 9A. In this portion D, an interval between the inner side face along the length direction of the sidewall pattern 32 and one side of the staircase shape portion 35 of the trimming pattern 33 opposing this inner side face in parallel is assumed to be E. Then, this interval E is a mismatch tolerance (Tol) along the direction in which the line portions 32 of the integrated circuit pattern 34 are arranged, of various mismatch tolerances (Tol) between the basic pattern 31 and the sidewall pattern 32 and the trimming pattern 33. Thus, to carry out the trimming exposure for removing the surplus pattern, the interval E needs to be suppressed to half or less of W1. In the meantime, the mismatch tolerance (Tol) is called matching allowance in other words.

Figure 9B:
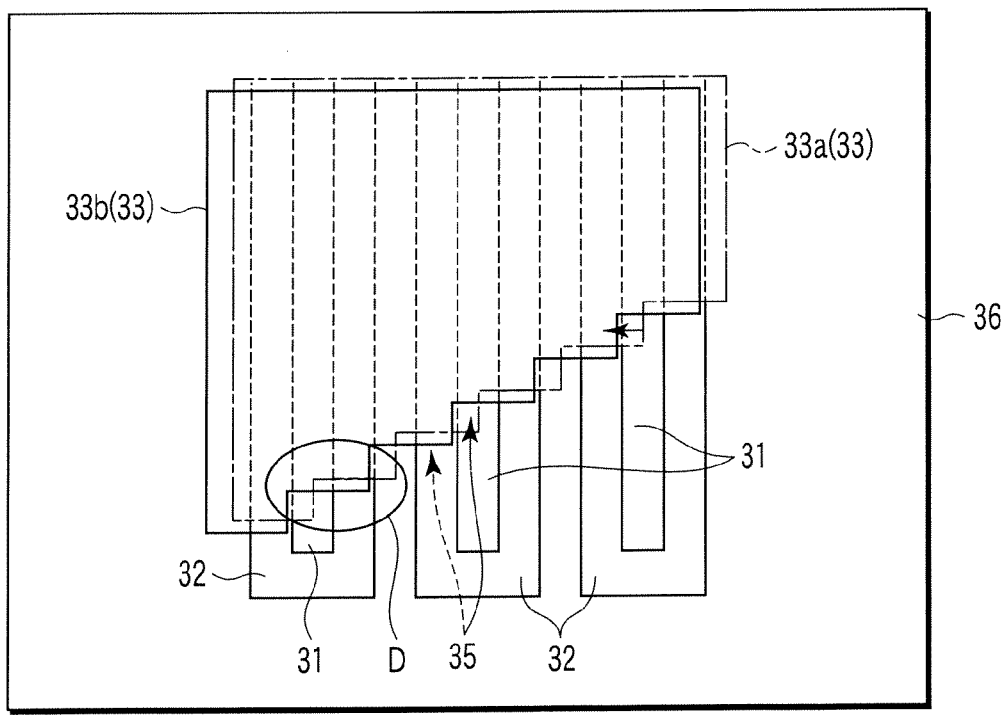

FIG. 9B shows the forming position of the trimming pattern 33 in the case where the mismatch between the basic pattern 31 and the sidewall pattern 32 is produced and the case where no such mismatch is produced. More specifically, a trimming pattern 33a having no mismatch, formed at an appropriate position within the mismatch tolerance (Tol) between the basic pattern 31 and the sidewall pattern 32 is indicated with a dot and dash line in FIG. 9B. Contrary to this, a trimming pattern 33b having the mismatch formed at an inappropriate position out of the mismatch tolerance (Tol) between the basic pattern 31 and the sidewall pattern 32 is indicated with a solid line in FIG. 9B. The inappropriate trimming pattern 33b is overlapped with the basic pattern 31 and the sidewall pattern 32 such that it is shifted to the left side with respect to the appropriate trimming pattern 33a as shown with a solid arrow line in FIG. 9B.

Figure 10A:
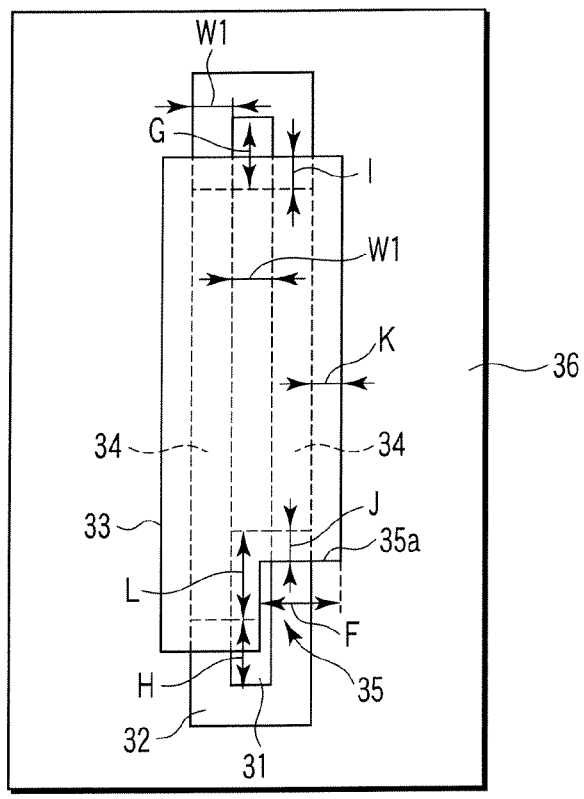
FIGS. 10A and 10B are plan views showing the mismatch shown in FIGS. 9A and 9B in further detail.
Figure 10B:
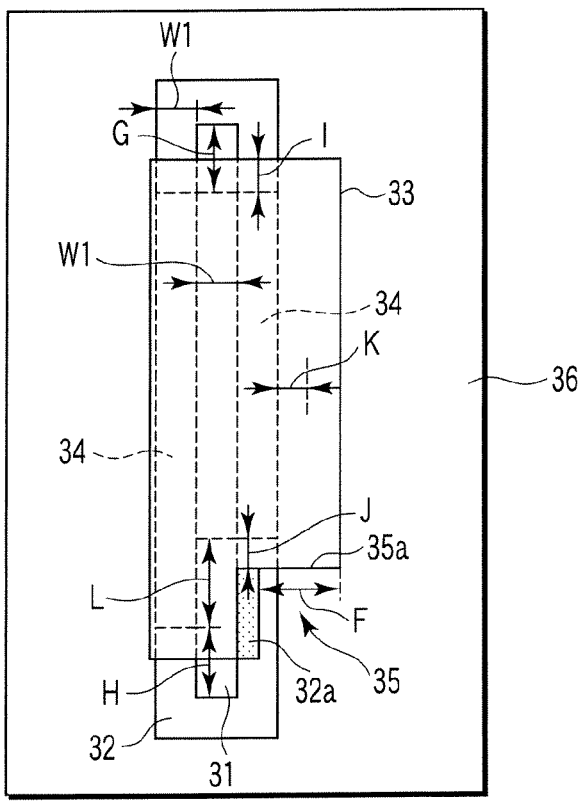

FIGS. 10A and 10B show the positional relation among the trimming pattern 33, the basic pattern 31 and the sidewall pattern 32 when trimming exposure is carried out by enlarging partly. More specifically, as regards an overlapping position of the trimming pattern 33 with the basic pattern 31 and the sidewall pattern 32, particularly, the portion D surrounded by the solid line in FIGS. 9A and 9B and its surrounding state are indicated in FIGS. 10A and 10B.

In FIGS. 10A and 10B, the basic pattern 31 is so formed that its size along the width direction thereof meets the minimum line width W1. Further, the sidewall pattern 32 is so formed that the width of a portion thereof in contact with the longer side of the basic pattern 31 is the minimum line width W1. That is, the basic pattern 31 and the sidewall pattern 32 are formed such that their widths are in a relation of 1:1. Further, of plural sides constituting the staircase shaped portion 35 of the trimming pattern 33, the length of a portion indicated with F in FIGS. 10A and 10B is set to twice the minimum line width W1 of each of the basic pattern 31 and the sidewall pattern 32. That is, of plural sides constituting the staircase shaped portion 35 of the trimming pattern 33, the length F of a side 35a along a direction perpendicular to the length direction of the basic pattern 31 and the sidewall pattern 32 is set to 2W1.

The interval between both end portions in the length direction of portions which turn to two integrated circuit patterns 34 left on the semiconductor substrate 36 finally of the sidewall pattern 32 and both end portions in the length direction of the basic pattern 31, represented with G and H in FIGS. 10A and 10B is set larger than twice the mismatch tolerance (Tol). That is, the sidewall pattern 32 is trimmed so that the intervals G and H are larger than W1. In the meantime, the interval G is an interval between an end portion of the integrated circuit pattern 34 and an end portion of the basic pattern 31 on a side formed into the non-staircase shape with the positions of end faces arranged in line, of the intervals between the both end portions in the length direction of the integrated circuit pattern 34 and the both end portions in the length direction of the basic pattern 31. The interval H refers to an interval between an end portion of the longer integrated circuit pattern 34 and an end portion of the basic pattern 31, of intervals between the end portion of the integrated circuit pattern 34 and the end portion of the basic pattern 31 on a side formed into the staircase-like shape with the positions of end faces arranged not in line.

To execute the trimming exposure under the above-described setting, the interval between both end portions in the length direction of the shorter integrated circuit pattern 34 and both end portions of the trimming pattern 33 in the length direction of the integrated circuit pattern 34, represented with I and J in FIGS. 11A and 10B, is set substantially the same as the mismatch tolerance (Tol). That is, the trimming pattern 33 is formed and disposed such that the intervals I and J are substantially the same as W1. In the meantime, the interval I refers to an interval between an end portion of the integrated circuit pattern 34 and an end portion of the trimming pattern 33 on a side in which the integrated circuit pattern 34 is formed into the non-staircase-like shape, of the intervals between both end portions in the length direction of the shorter integrated circuit pattern 34 and the both end portions of the trimming pattern 33. Contrary to this, the interval J refers to an interval between the end portion of the integrated circuit pattern 34 and the end portion of the trimming pattern 33 on the side in which the integrated circuit pattern 34 is formed into the staircase-like shape, of the intervals between the both end portions in the length direction of the shorter integrated circuit pattern 34 and both end portions of the trimming pattern 33.

The interval between the side face of the integrated circuit pattern 34 on the most extreme end and the side face of the trimming pattern 33, indicated with K in FIG. 10A, is set substantially the same as the mismatch tolerance (Tol). That is, the trimming pattern 33 is formed and disposed so that the interval K between the long side face of the shorter integrated circuit pattern 34 and the side face of the trimming pattern 33 opposing the long side face is set substantially the same as W1. Finally, the sidewall pattern 32 is trimmed so that a difference between two adjacent sidewall patterns 32 which turn to the integrated circuit pattern 34 left on the semiconductor substrate 36 is L.

In this setting, the lower limit of the mismatch tolerance (Tol) of the trimming pattern 33 with respect to the basic pattern 31 and the sidewall pattern 32 is set to a value larger than half W1 and trimming exposure is executed as second PEP. Unless the mismatch is produced between the basic pattern 31 and the sidewall pattern 32 and the trimming pattern 33 as shown in FIG. 10A, a portion left on the semiconductor substrate 36 such that it is covered by the trimming pattern 33 of the basic pattern 31 and the sidewall pattern 32 can be subjected to appropriate trimming exposure in a condition in which it is covered by the trimming pattern 33 in a specified way.

Assume that as indicated with a solid line in FIG. 10B, the trimming pattern 33 is shifted to the right side from an appropriate position shown in FIG. 10A so that a mismatch is produced between the basic pattern 31 and the sidewall pattern 32 and the trimming pattern 33. Consequently, as indicated by a dotted portion 32a in FIG. 10B, a portion which should be exposed from the trimming pattern 33 and removed of the sidewall pattern 32 might be covered by the trimming pattern 33. Alternatively, a pattern 32a very much finer than W1 might be produced on the semiconductor substrate 36 after the trimming exposure process. Then, if such surplus pattern 32a is left on the semiconductor substrate 36, it can be cause for a fault such as a short circuit or broken interconnect. In the meantime, the dotted line indicating a range K in FIG. 10B indicates the position of an edge portion of the trimming pattern 33 when the trimming pattern 33 is overlapped with the basic pattern 31 and the sidewall pattern 32 appropriately as shown in FIG. 10A.

If the integrated circuit pattern 34 composed of the fine, staircase shaped line-and-space pattern is formed by adopting an ordinary sidewall leaving process, the ordinary staircase shaped trimming pattern 33 formed corresponding to the shape of the integrated circuit pattern 34 has a small mismatch tolerance. That is, to form the fine, staircase shaped integrated circuit pattern 34 by adopting the ordinary sidewall leaving process, the trimming exposure needs to be carried out under such a strict condition conventionally. As a result, any faulty pattern which can lead to a short circuit or broken interconnect is likely to be formed, so that the rate of producing defective semiconductor products rises easily. To make it difficult for any faulty pattern to be formed, the overlapping process for the basic pattern 31 and the sidewall pattern 32 with the trimming pattern 33 takes a long time thereby likely productivity of the semiconductor device being dropped. That is, the performance, quality, reliability and yield of the semiconductor device as a product drop easily.

To solve problems which are likely to be produced in the sidewall leaving process of removing the surplus pattern using the staircase-like trimming pattern 33, for example, Jpn. Pat. Appln. KOKAI Publication No. 2006-186104 has disclosed a process of leaving the sidewall for removing the surplus pattern using an oblique trimming pattern. Using the oblique trimming pattern has such an advantage that even if the lower limit of the mismatch tolerance (Tol) is set to a value larger than half W1, the fault described with reference to FIG. 10B is hard to produce. However, according to the conventional method using the oblique trimming pattern, data of the oblique trimming pattern needs to be designed at the same time when data of the integrated circuit pattern 34 is designed. Thus, the conventional method using the oblique trimming pattern suffered from a large load in data handling. To reduce the load in data handling, it is desirable that data of the oblique trimming pattern can be designed after design data of the integrated circuit pattern 34 is output after its tape-out.

There will be described the technology of this embodiment capable of automatically generating data of the mask pattern for removing the surplus pattern formed in super resolution process technology using the sidewall leaving process based on only the design data of the integrated circuit pattern independently of the design of the integrated circuit pattern.

Figure 11:
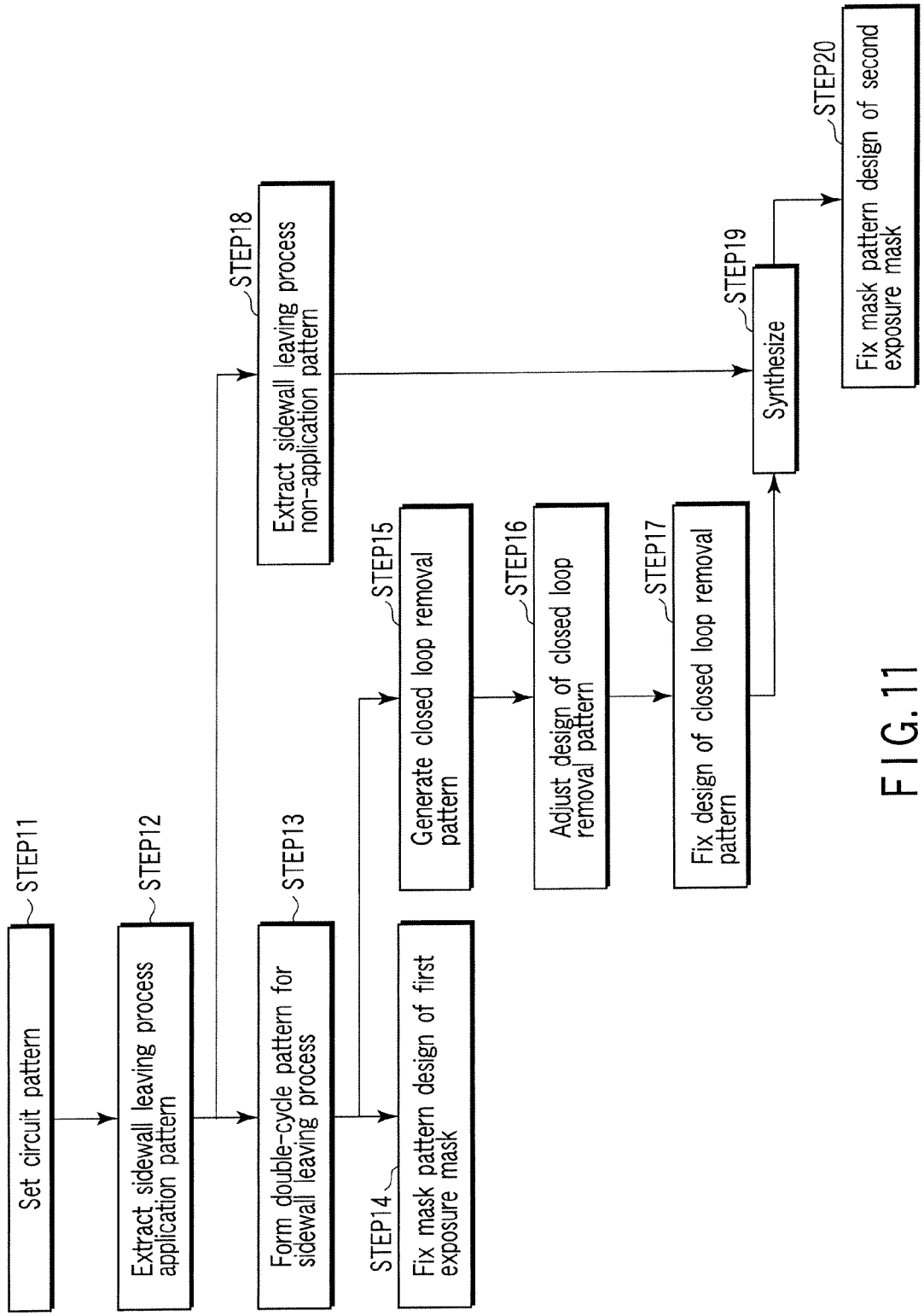
FIG. 11 is a flow chart showing a pattern creation method according to a third embodiment.

First, a physical layout necessary for a certain process in the semiconductor circuit design pattern as the integrated circuit pattern 34 designed preliminarily is set up as a circuit pattern as shown in FIG. 11. This is set up as STEP 11. This circuit pattern is, for example, a device separating area formation pattern or a gate layer formation pattern.

Next, as shown in FIG. 11, data of a pattern to be formed by adopting the sidewall leaving process is extracted from data of the circuit pattern set in STEP 11. This is set up as STEP 12. As an extraction method in STEP 12, for example, the following several methods can be exemplified. As a first extraction method, first, the sidewall leaving process application pattern and the sidewall leaving process non-application pattern are classified preliminarily as data type. After that, using the classified data, only the sidewall leaving process application pattern is extracted from data of the circuit pattern with the sidewall leaving process application pattern and the sidewall leaving process non-application pattern classified. As a second extraction method, by specifying a predetermined area in the entire circuit pattern, a pattern to which the sidewall leaving process is to be applied may be extracted from that area or a pattern to which the sidewall leaving process is not to be applied may be classified as being not to be extracted. Further, as a third extraction method, it is permissible to set up an extraction rule of automatically extracting the sidewall leaving process application pattern from the circuit pattern depending on whether or not the line width of the pattern is less than a set line width (W1).

Figure 12A:
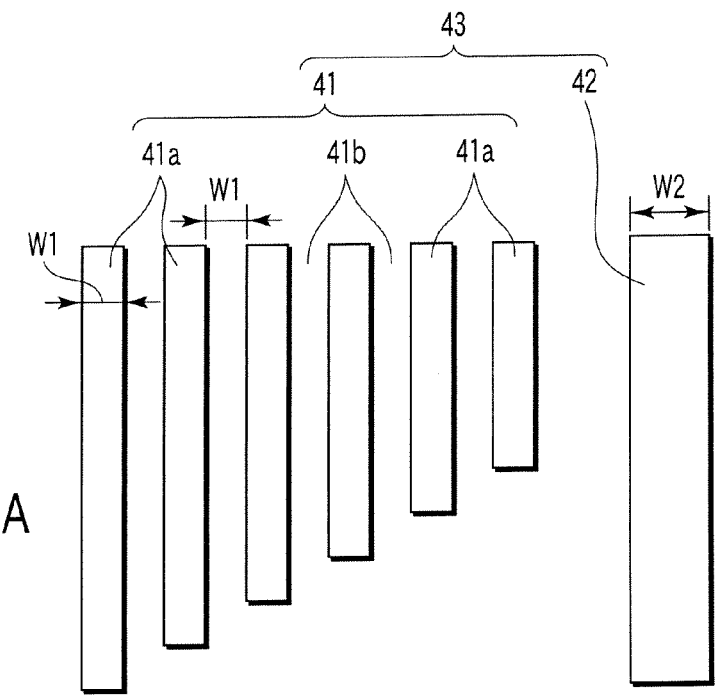
FIGS. 12A and 12B are plan views showing the pattern creation process in the pattern creation method according to the third embodiment.
Figure 12B:
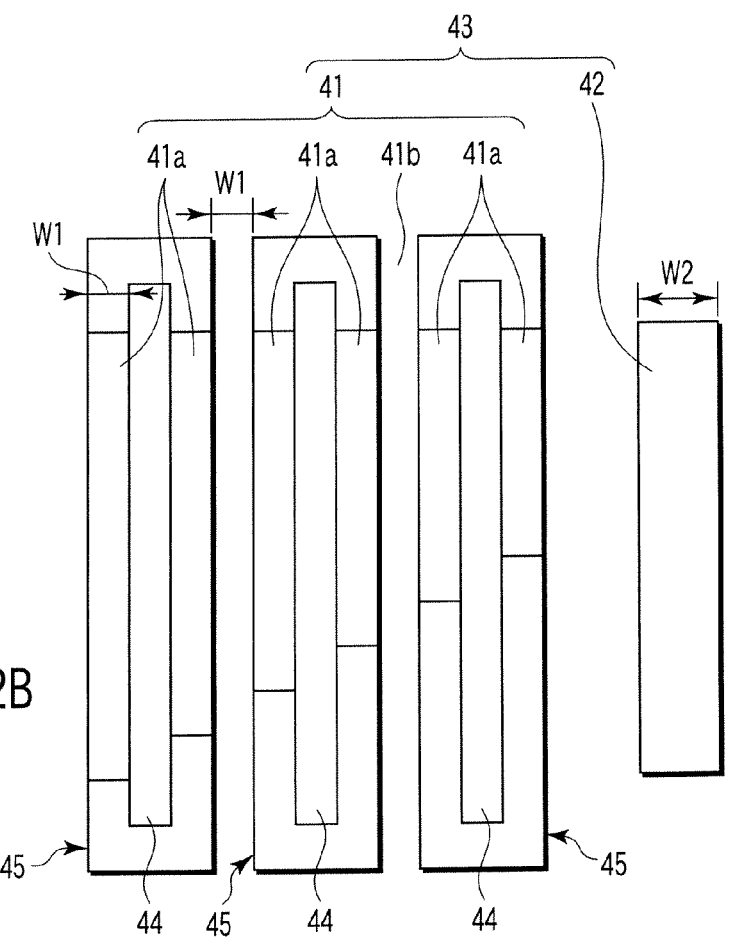

FIG. 12A shows a sidewall leaving process application pattern 41 corresponding to data extracted in STEP 12 and a sidewall leaving process non-application pattern 42 proximate to the sidewall leaving process application pattern 41. The sidewall leaving process application pattern 41 and the sidewall leaving process non-application pattern 42 constitute part of a circuit pattern 43 set in STEP 11. In the sidewall leaving process application pattern 41, as shown in FIG. 12A, a plurality of line portions 41a each having a width W1 are arranged at the same interval W1 as the width of the line portion and they are configured into a staircase shape in which they are extended or contracted as they go from one side to the other side along a direction of the arrangement. That is, the sidewall leaving process application pattern 41 is a line-and-space pattern formed in the staircase configuration in which the width of the line portion 41a and the width of the space portion 41b are in a relation of 1:1.

Next, as shown in FIG. 11, data processing for forming a double-cycle pattern which serves as a sidewall pattern for the sidewall leaving process is performed on data of the sidewall leaving process application pattern 41 extracted in STEP 12. This is set as STEP 13. The data processing of this STEP 13 is carried out by applying any pattern creation method of the first and second embodiments.

FIG. 12A shows both the sidewall leaving process application pattern 41 to which the data processing is performed in STEP 13 and the sidewall leaving process non-application pattern 42. Each line portion 41a of the sidewall leaving process application pattern 41 after the data processing is performed in STEP 13 is formed as part of the sidewall pattern 45 surrounding the side portion of the plural basic patterns 44.

Next, as shown in FIG. 11, a design of the mask pattern for a first exposure mask for forming the sidewall pattern 45 is fixed based on data of the sidewall leaving process application pattern 41 to which the data processing is performed in STEP 13. This is set as STEP 14. The sidewall pattern formation mask pattern is formed through this STEP 14.

When as described above, the exposure process is carried out by applying the sidewall leaving process based on the sidewall pattern 45 as a double-cycle pattern formed in STEP 13, a closed loop composed of surplus pattern is always formed on both end portions of the sidewall pattern 45. To remove this closed loop, data of a pattern for removing the closed loop is generated as shown in FIG. 11. This is set as STEP 15. Because various designs may coexist at an end portion of the sidewall pattern 45, the closed loop is desired to be deleted by automatic processing. Hereinafter, a method for creating data of the closed loop removal pattern for removing the closed loop of this embodiment will be described.

Figure 13A:
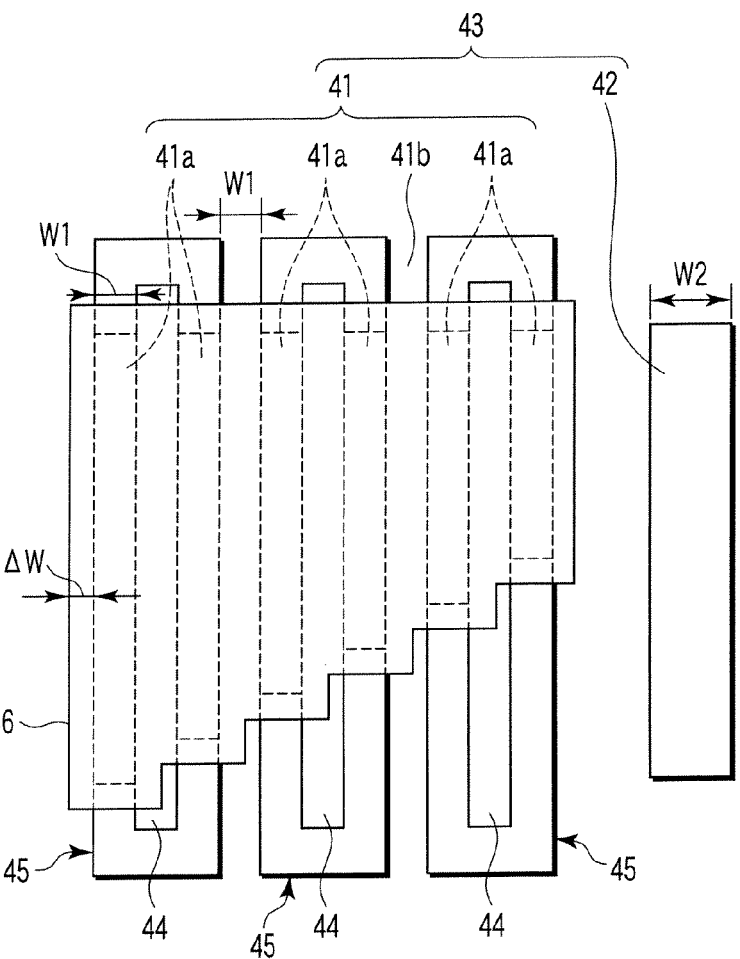
FIGS. 13A and 13B are plan views showing the pattern creation process in the pattern creation method according to the third embodiment.

First, as shown in FIG. 13A, data of a cover pattern 46 for covering a line portion 41a of the sidewall leaving process application pattern 41 of the sidewall pattern 45 and a portion sandwiched by the line portions 41a of the basic pattern 44 is generated. This cover pattern 46 serves as a major portion of the trimming pattern as the closed loop removal pattern 50 of this embodiment. As shown in FIG. 11, data of the cover pattern 46 may be created by resizing data of each line pattern 41a extracted as the sidewall leaving process application pattern 41 by a predetermined positive bias amount ΔW. In the meantime, the positive bias amount ΔW mentioned here needs to be at least larger than an overlay accuracy (Tol) for closed loop removal exposure as a second PEP with respect to the sidewall pattern formation exposure as the first PEP. Needless to say, the positive bias amount ΔW is desired to be of resize amount by which the sidewall leaving process application pattern 41 extracted in STEP 12 can be covered by the cover pattern 46 substantially entirely.

At this stage, part of the cover pattern 46 is just formed into the staircase shape corresponding to the line portions 41a of the sidewall leaving process application pattern 41 like the ordinary trimming pattern 33. Thus, if the closed loop removal exposure is carried out using the cover pattern 46 at this stage as the closed loop removal pattern 50 just in that shape, when a mismatch is produced between the sidewall pattern formation exposure and the closed loop removal exposure, there is a risk that the unwanted fine pattern may be formed on the wafer after the processing is finished. Thus, according to this embodiment, to suppress production of the unwanted fine pattern, a design data adjustment method described below is further applied to data of the cover pattern 46. Consequently, the design of the cover pattern 46 is adjusted. This is set as STEP 16.

Figure 13B:
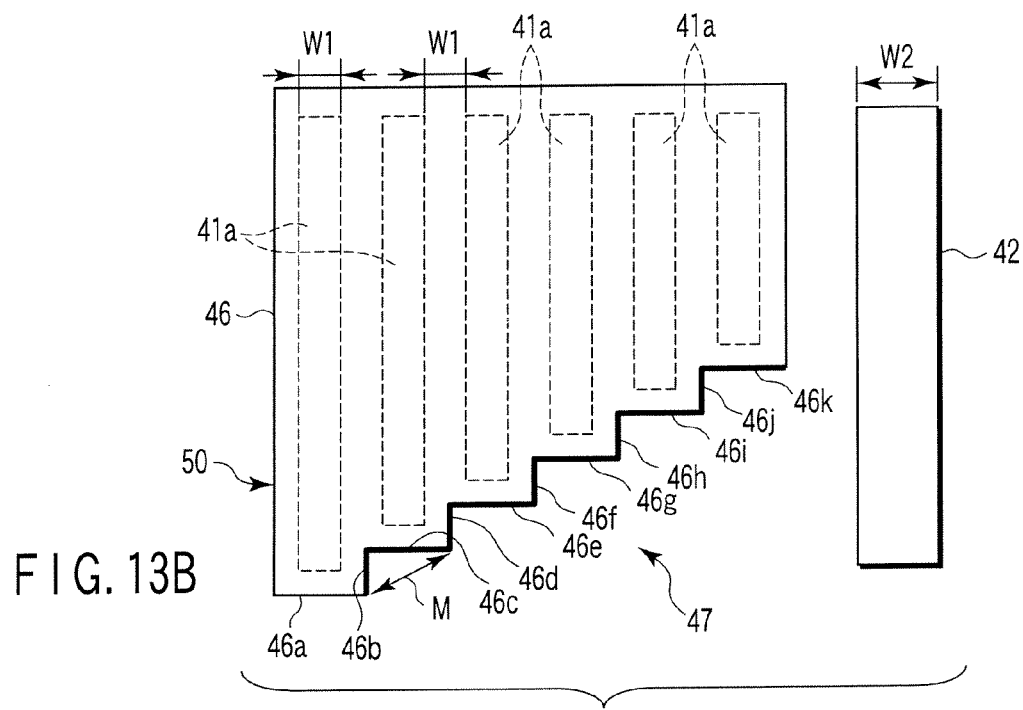

As indicated with a bold solid line in FIG. 13B, data of plural edge portions 46a, 46b, 46c, 46d, 46e, 46f, 46g, 46h, 46i, 46j, 46k constituting the staircase shaped portion 47 of the cover pattern 46 is extracted based on predetermined design rule check (DRC). Here, the respective edge portions 46a to 46k are divided by each predetermined edge length and data of each divided edge portions 46b to 46k is extracted. The edge length which serves as a unit of division needs to satisfy the minimum dimension of the design rule. At the same time, the edge length which serves as the unit of the division is set up in proportion to the minimum dimension of the design rule. More specifically, the staircase shaped portion 47 is sectioned such that an interval between the pattern outside opposing sides, which is the length of a diagonal line between the adjoining respective edge portions 46a to 46k indicated with an arrow M in FIG. 13B is smaller than the predetermined Wouter_check. Then, data of each sectioned edge portion 46a to 46k except the edge portion 46a is extracted. In the meantime, this data extraction process can be executed using an ordinary tool such as design rule checker used in ordinary semiconductor circuit design process.

Figure 14A:
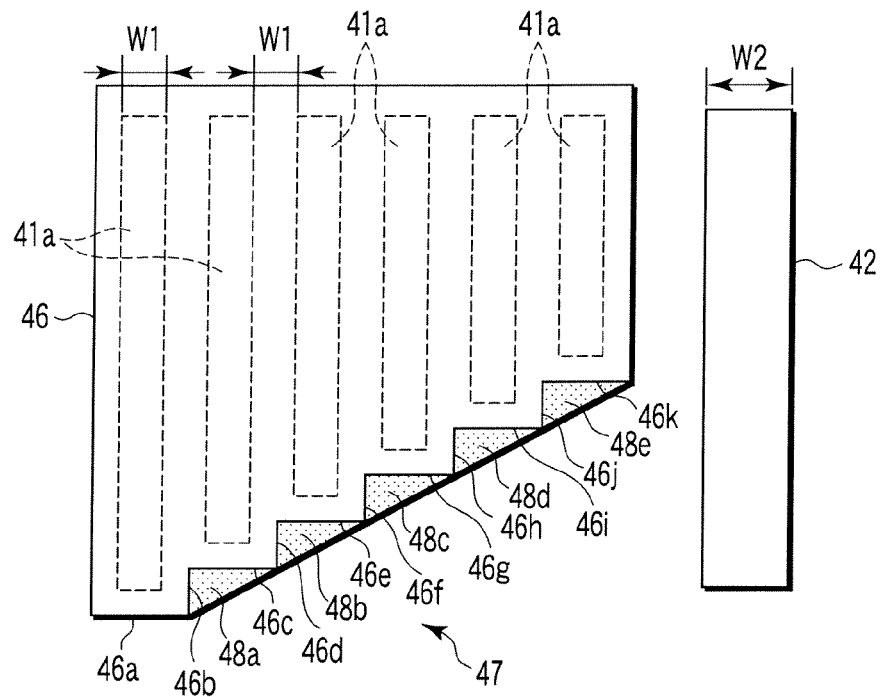
FIGS. 14A and 14B are plan views showing the pattern creation process in the pattern creation method according to the third embodiment.

Next, as indicated by a dotted portion in FIG. 14A, as for the edge portions 46b to 46k extracted by the above-mentioned process, data of polygon containing two sides which connect two edge portions sharing the positions of end portions of the respective edge portions 46b to 46k is generated. Here, data of plural triangular patterns (circumscribing patterns) 48a, 48b, 48c, 48d, 48e which use two edge portions adjoining each other of the edge portions 46b to 46k as two sides while contacting (circumscribing) the staircase shaped portion 47 of the cover pattern 46 is generated. More specifically, the respective edge portions 46b to 46k are divided by each combination of two continuous edge portions which intersect each other to form an angle portion at right angle outside the cover pattern 46. That is, the respective edge portions 46b to 46k are divided by each combination of edge portion 46b and edge portion 46c, edge portion 46d and edge portion 46e, edge portion 46f and edge portion 46g, edge portion 46h and edge portion 46i, and edge portion 46j and edge portion 46k. Then, data of plural right-angled triangle shaped patterns 48a to 48e, which use edge portions 46b to 46k divided by such a combination as two sides and an oblique side connecting these two sides while contacting (circumscribing) the staircase shape portion 47 of the cover pattern 46 is generated.

Figure 14B:
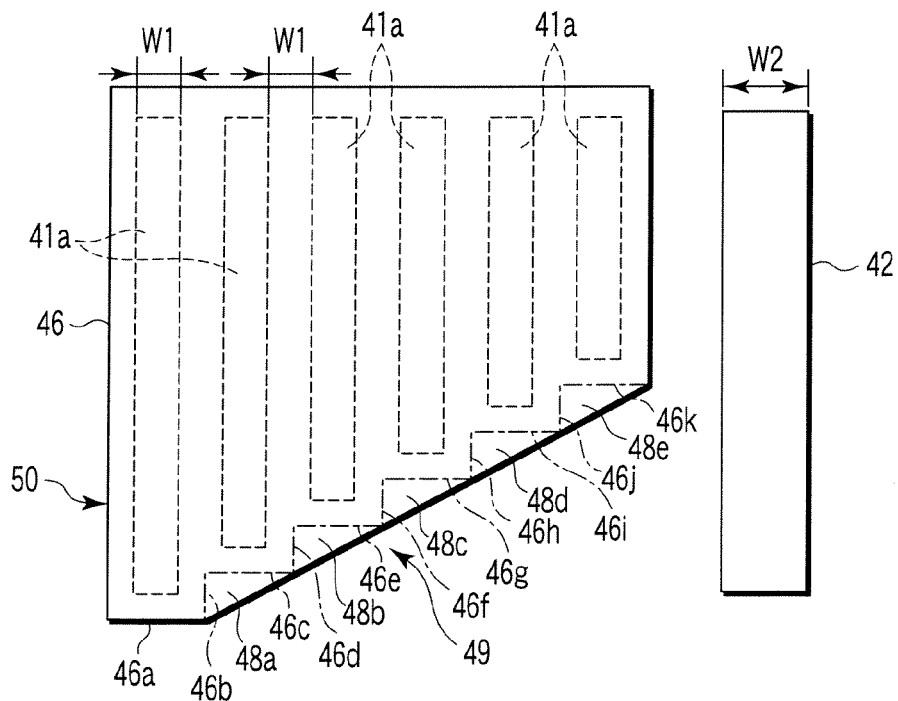

As shown in FIG. 14B, the right triangular patterns 48a to 48e created in the above-described process are combined to a cover pattern 46. More specifically, a logical sum of data of group of the right triangular patterns 48a to 48e and the cover pattern 46 is obtained. Consequently, the closed loop removal pattern 50 of this embodiment having an oblique edge 49 formed smoothly obliquely as an unwanted portion removal edge for removing the closed loop composed of the surplus pattern is formed. That is, the closed loop removal pattern 50 shown in FIG. 14B is a trimming pattern of this embodiment.

Next, as shown in FIG. 11, design of the closed loop removal pattern 50 formed by adjusting the design of the cover pattern 46 in STEP 16 is fixed. This is set as STEP 17.

Data of the sidewall leaving process non-application pattern 42 is left in data of the circuit pattern 43 from which data of the sidewall leaving process application pattern 41 is extracted in STEP 12. Data of this sidewall leaving process non-application pattern 42 is extracted from data of the circuit pattern 43 as shown in FIG. 11. This is set as STEP 18.

Next, as shown in FIG. 11, data of the closed loop removal pattern 50 in which the pattern design is fixed in STEP 17 and data of the sidewall leaving process non-application pattern 42 extracted in STEP 18 are synthesized. This is set as STEP 19.

Next, as shown in FIG. 11, design of the mask pattern for a second exposure mask for performing the closed loop removal exposure is fixed based on the synthesized data of the closed loop removal pattern 50 and the sidewall leaving process non-application pattern 42, which are synthesized in STEP 19. This is set as STEP 20. A mask pattern for removal of the unwanted portion is formed through this STEP 20. The pattern creation method according to this embodiment is terminated here.

Figure 15:
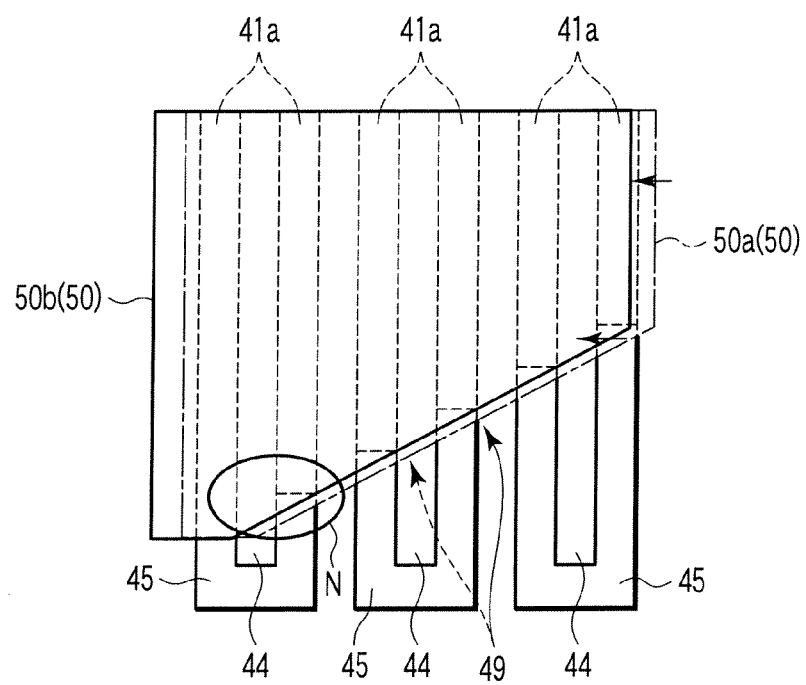
FIG. 15 is a plan view showing the mismatch in the pattern creation method according to the third embodiment.

FIG. 15 shows formation positions of the closed loop removal patterns 50 in the case where the mismatch between the basic pattern 44 and the sidewall pattern 45 is produced and the case where no such mismatch is produced. More specifically, the closed loop removal pattern 50a containing no mismatch formed at an appropriate position within the aforementioned mismatch tolerance (Tol) to the basic pattern 44 and the sidewall pattern 45 is expressed with a dot and dash line in FIG. 15. Contrary to this, the closed loop removal pattern 50b having the mismatch formed at an inappropriate position out of the mismatch tolerance (Tol) to the basic pattern 44 and the sidewall pattern 45 is expressed with a solid line in FIG. 15. The inappropriate closed loop removal pattern 50b is overlaid on the basic pattern 44 and the sidewall pattern 45 such that it is shifted to the left side with respect to the appropriate closed loop removal pattern 50a, as indicated with a solid line in FIG. 15.

Figure 16A:
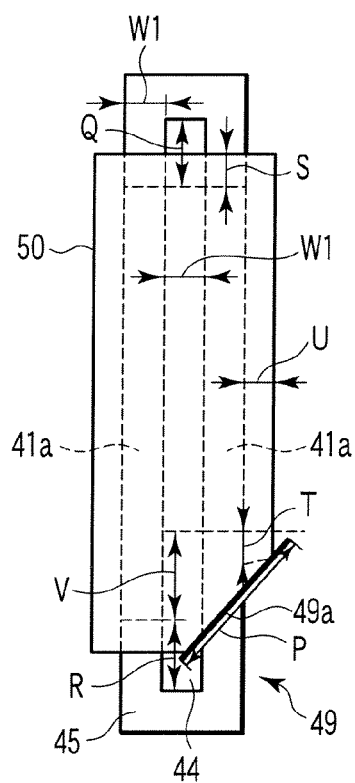
FIGS. 16A and 16B are plan views showing the mismatch shown in FIG. 15 in further detail.
Figure 16B:
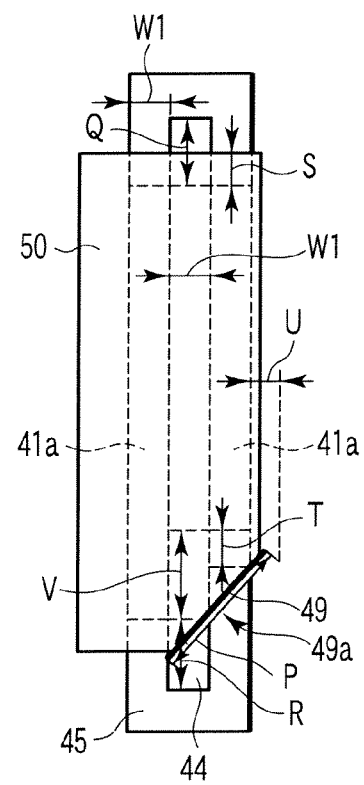

FIGS. 16A and 16B show the positional relation among the closed loop removal pattern 50, the basic pattern 44 and the sidewall pattern 45 upon trimming exposure by enlarging partially. More specifically, as regards the overlay position of the closed loop removal pattern 50 to the basic pattern 44 and the sidewall pattern 45, particularly, a portion N surrounded by a solid line in FIG. 15 and its surrounding portion are expressed in FIGS. 16A and 16B in enlargement.

In FIGS. 16A and 16B, the basic pattern 44 is formed such that the size thereof in the width direction is of minimum line width W1. At the same time, the sidewall pattern 45 is formed such that the width of a portion in contact with the longer sides of the basic pattern 44 is of the minimum line width W1. That is, the basic pattern 44 and the sidewall pattern 45 are formed such that their widths are in a relation of 1:1. Further, of sides constituting the oblique edge portion 49 of the closed loop removal pattern 50, the length of a portion indicated by P in FIGS. 16A and 16B is set to twice the minimum line width W1 of the basic pattern 44 and the sidewall pattern 45. That is, of sides constituting the oblique edge portion 49 of the closed loop removal pattern 50, the length P of a side 49a crossing a line portion 41a obliquely of the sidewall leaving process application pattern 41 is formed in 2W1.

Intervals between both end portions in the length direction of each line portion 41a of the sidewall leaving process application pattern 41 of the sidewall pattern 45 and both end portions in the length direction of the basic pattern 44, indicated with Q and R in FIGS. 16A and 16B are set to more than twice the mismatch tolerance (Tol). That is, the sidewall pattern 45 is trimmed so that the intervals Q and R are both larger than W1. The interval Q is an interval between an end portion of the line portion 41a and an end portion of the basic pattern 44 on a side formed into the non-staircase shape with end faces arranged in line, of the intervals between the both end portions in the length direction of each line portion 41a and the both end portions in the length direction of the basic pattern 44. Contrary to this, the interval R is an interval between the end portion of the longer line portion 41a and the end portion of the basic pattern 44, of the intervals between the end portions of the line portion 41a and the end portion of the basic pattern 44 on a side formed in the staircase-like shape with end faces arranged not in line.

Then, to expose the closed loop composed of the surplus pattern under the above-described setting in order to remove it, the interval between the both end portions in the length direction of the shorter line portion 41a of the respective line portions 41a and the both end portions of the closed loop removal pattern 50 along the length direction of the line portion 41a, indicated with S and T in FIGS. 16A and 16B is set substantially the same as the mismatch tolerance (Tol). That is, the closed loop removal pattern 50 is formed such that both the intervals S and T are substantially the same as W1. In the meantime, the interval S is an interval between the end portion of the line portion 41a on a side in which the line portion 41a is formed into a non-staircase shape and the end portion of the closed loop removal pattern 50, of intervals between the both end portions in the length direction of the shorter line portion 41a and the both end portions of the closed loop removal pattern 50. Contrary to this, the interval T is an interval between the end portion of the line portion 41a on a side in which the line portion 41a is formed into the staircase shape and the end portion of the closed loop removal pattern 50, of the intervals between the both end portions in the length direction of the shorter line portion 41a and the both end portions of the closed loop removal pattern 50.

An interval between the side face of the most extreme end line portion 41a and the side face of the closed loop removal pattern 50, indicated with U in FIG. 16A is set substantially the same as the mismatch tolerance (Tol). That is, the closed loop removal pattern 50 is formed such that the interval U between the longer side face of the shorter line portion 41a and the side face of the closed loop removal pattern 50 opposing this longer side face is substantially equal to W1. That is, the sidewall pattern 45 is trimmed such that a difference between the lengths of two adjoining line portions 41a, which ultimately turn to the line portions 41a left on the semiconductor substrate, is V.

Under this setting, the closed loop removal exposure is carried out as the second PEP by setting the lower limit of the mismatch tolerance (Tol) of the closed loop removal pattern 50 with respect to the basic pattern 44 and the sidewall pattern 45 to a value larger than half W1. At this time, if as shown in FIG. 16A, no mismatch is produced among the basic pattern 44, the sidewall pattern 45 and the closed loop removal pattern 50, appropriate trimming exposure can be executed under the condition that a portion covered by the basic pattern 44, the sidewall pattern 45 and the closed loop removal pattern 50 to be left on the semiconductor substrate is covered by the predetermined closed loop removal pattern 50.

Assume that as indicated with a solid line in FIG. 16B, the closed loop removal pattern 50 is shifted to the left side from an appropriate position shown in FIG. 16A so that a mismatch is produced among the basic pattern 44, the sidewall pattern 45 and the closed loop removal pattern 50. However, in such a case, the closed loop removal pattern 50 of this embodiment in which the portion corresponding to the staircase shaped portion 35 is formed as a straight oblique edge portion 49 produces a different result from the case described with reference to FIG. 10B, different from the ordinary trimming pattern 33 having the staircase shaped portion 35.

More specifically, according to this embodiment, even if the mismatch is produced among the basic pattern 44, the sidewall pattern 45 and the closed loop removal pattern 50, there is little risk that the portion which is exposed form the closed loop removal pattern 50 and to be removed of the sidewall pattern 45 might be covered by the closed loop removal pattern 50, as shown in FIG. 16A. That is, there is little risk that a very much finer pattern than W1 might be left on the semiconductor substrate after the closed loop removal exposure is executed. Further, there is little risk of a fault such as a short circuit or broken interconnect due to the surplus pattern left on the semiconductor substrate being produced. In the meantime, the dotted line indicating the range of U in FIG. 16B indicates the position of an edge portion of the closed loop removal pattern 50 when the closed loop removal pattern 50 is overlaid on the basic pattern 44 and the sidewall pattern 45 appropriately as shown in FIG. 16A.

To form the integrated circuit pattern 41 composed of fine, staircase shaped line-and-space pattern by adopting the sidewall leaving process, the mismatch tolerance of the closed loop removal pattern 50 with respect to the basic pattern 44 and the sidewall pattern 45 can be increased by using the closed loop removal pattern 50 of this embodiment having the oblique edge portion 49 as a trimming pattern. More specifically, the lower limit of the mismatch tolerance (Tol) of the closed loop removal pattern 50 with respect to the basic pattern 44 and the sidewall pattern 45 can be set to a value larger than half W1. As a result, when forming the fine, staircase shaped integrated circuit pattern 41 by adopting the sidewall leaving process, the trimming exposure can be carried out under a milder condition. Consequently, a defective pattern due to a short circuit or broken interconnect becomes unlikely, thereby reducing the rate of fault occurrence in the semiconductor device. Further, the time required for overlaying the basic pattern 44, the sidewall pattern 45 with the closed loop removal pattern 50 can be reduced thereby improving productivity of the semiconductor device. That is, the performance, quality, reliability and yield of the semiconductor device as a product can be improved.

According to the above-mentioned method using the oblique trimming pattern disclosed in Jpn. Pat. Appln. KOKAI Publication No. 2006-186104, when data of the integrated circuit pattern is designed, data of the oblique trimming pattern needs to be designed. For this reason, load in data handling is large. Contrary to this, according to this embodiment, as descried above, after data of the integrated circuit pattern 41 is designed, data of the closed loop removal pattern 50 having the oblique edge portion 49 is designed. Consequently, this embodiment can reduce the load in data handling as compared with conventionally.

As described above, according to the third embodiment, the same effect as the first and second embodiments can be obtained. Further, according to this embodiment, data of the trimming mask pattern 50 for removing the surplus pattern formed under ultra resolution process technology using the sidewall leaving process can be automatically generated based on only design data of the integrated circuit pattern 41 independently of design of the integrated circuit pattern 41. Although detailed description accompanied by representation is omitted, as in the first and second embodiments, the pattern creation method of this embodiment can be executed appropriately by operating the pattern creating device capable of executing the pattern creation method of this embodiment according to the pattern creation program which can make the pattern creating device execute the pattern creation method of this embodiment.

FOURTH EMBODIMENT

Next, a fourth embodiment of the present invention will be described with reference to FIGS. 17A, 17B and 18. In the meantime, like reference numerals are attached to the same components as the first to third embodiments and detailed description thereof is omitted.

In this embodiment, a case of applying a predetermined restriction condition upon creation of the oblique edge portion 49 described in the third embodiment will be described.

Figure 17A:
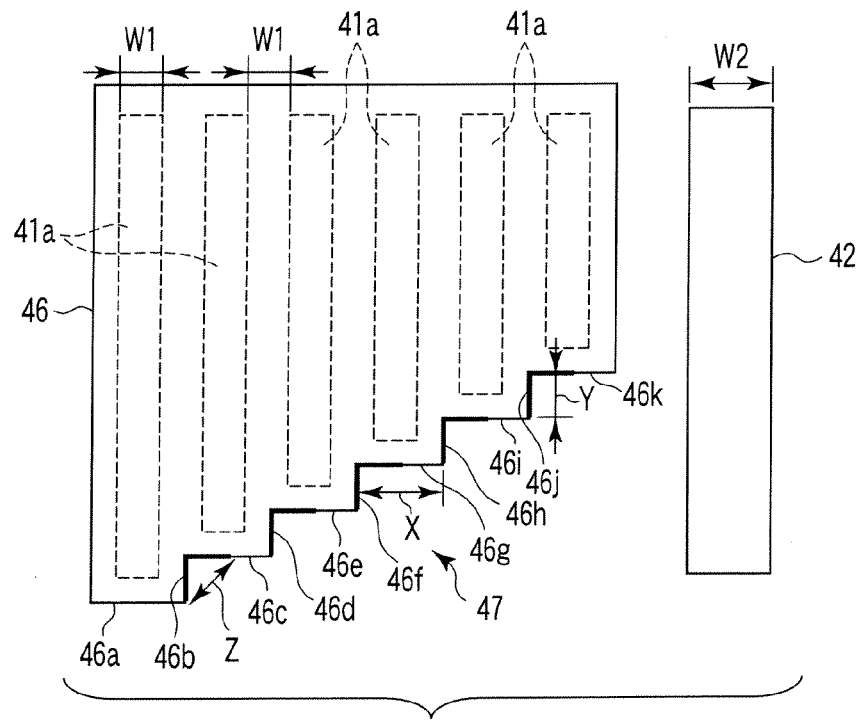
FIGS. 17A and 17B are plan views showing a pattern creation process in a pattern creation method according to a fourth embodiment.

According to this embodiment, as shown in FIG. 17A, of the edge portions 46a to 46k constituting the staircase shaped portion 47 of the cover pattern 46, the length of the respective edge portions 46a, 46c, 46e, 46g, 46i, 46k extending in a direction in which the line portions 41a are arranged is assumed to be X. Here, this length X is set to twice the minimum line width W1 of the line portion 41a. That is, the length of the edge portions 46a, 46c, 46e, 46g, 46i, 46k along the height direction of the staircase shaped portion 47 of the cover pattern 46 is assumed to be X. Of the respective edge portions 46a to 46k constituting the staircase shaped portion 47 of the cover pattern 46, the length of the edge portions 46b, 46d, 46f, 46h and 46j in the length direction of the line portions 41a of the edge portions 46a to 46k is assumed to be Y. That is, the length of the respective edge portions 46b, 46d, 46f, 46h and 46j in the width direction of the staircase shaped portion 47 of the cover pattern 46 is assumed to be Y. At the same time, Y is set to a smaller value than X. Then, like the third embodiment, the edge portions 46a to 46k are divided by a predetermined range and data of the respective divided edge portions 46a to 46k excluding the edge portion 46a is extracted.

More specifically, as indicated with a bold solid line in FIG. 17A, data of two sides of the same length perpendicular to each other is extracted from the adjoining edge portions 46a to 46k so that the diagonal line of the two sides is smaller than the amount of Wouter_check. In this embodiment, the amount of Wouter_check indicated with an arrow Z in FIG. 17A is defined to be $\sqrt{2}$ times a smaller one of the width X and the height Y of each step of the staircase shape portion 47. Therefore, the amount of Wouter_check of this embodiment is $\sqrt{2}$ times larger than the length Y of the edge portions 46b, 46d, 46f, 46h, 46j which is the length of each step of the staircase shaped portion 47. In the meantime, the size of $\sqrt{2}$ is a proportionality coefficient to the minimum size of the design rule.

Figure 17B:
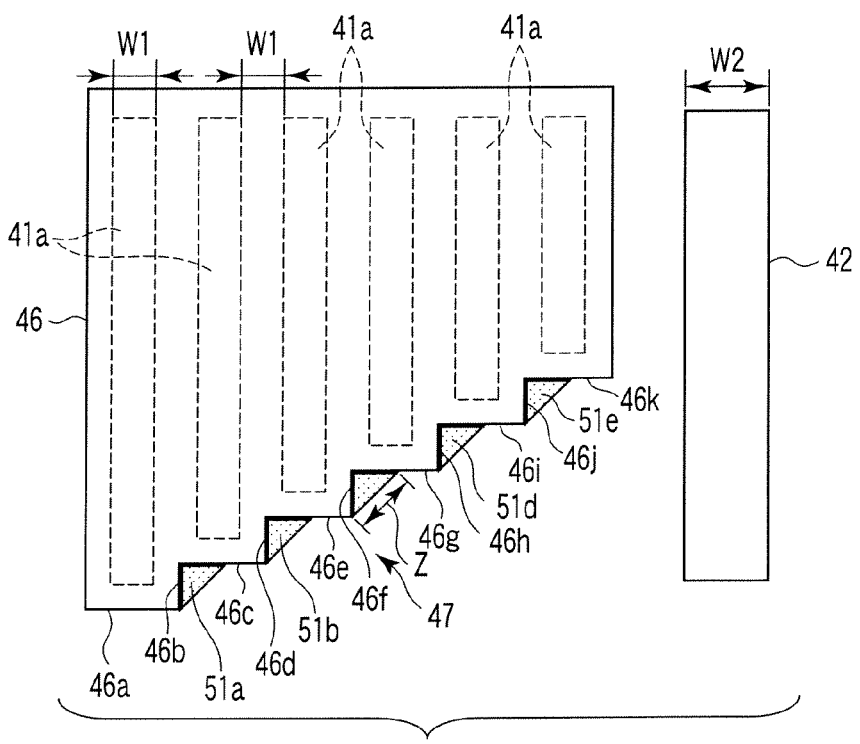

Next, as shown by a dotted portion of FIG. 17B, data of plural triangular patterns (circumscribing patterns) 51a, 51b, 51c, 51d, 51e which contain two sides sharing the position of an end portion while contacting (circumscribing) the staircase shape portion 47 of the cover pattern 46 is generated. According to the above-described setting, the triangular patterns 51a, 51b, 51c, 51d, 51e produced in this embodiment have the edge portions 46b, 46d, 46f, 46h, 46j as a side. Then, they have sides which have the same length Y as the edge portions 46b, 46d, 46f, 46h, 46j and another side which is perpendicular to the edge portions 46b, 46d, 46f, 46h and 46j. Further, they have a side which has a length √2 the length Y of the edge portions 46b, 46d, 46f, 46h, 46j and while crossing obliquely at an angle of 45° with the length direction of the line portion 41a as a remaining side. Therefore, the triangular patterns 51a, 51b, 51c, 51d, 51e of this embodiment are of isosceles right-angled triangle. In the meantime, the length of an oblique side crossing at an angle of 45° with respect to the length direction of the line portion 41a, indicated with Z in FIG. 17B, of the three sides of the respective isosceles right triangular patterns 51a, 51b, 51c, 51d, 51e is set to a smaller value than 2W1.

Figure 18:
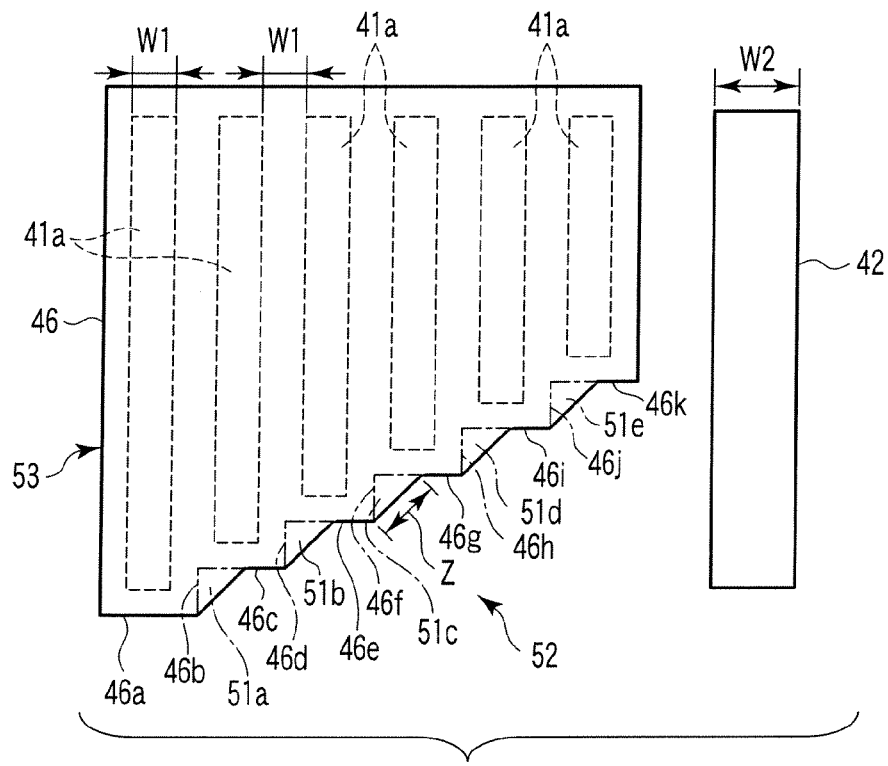
FIG. 18 is a plan view showing the pattern creation process in the pattern creation method according to the fourth embodiment.

Next, as shown in FIG. 18, the respective isosceles right triangular patterns 51a to 51e created in the above-described process are integrated with the cover pattern 46. More specifically, a logical sum between data of a group of the isosceles right triangular patterns 51a to 51e and data of the cover pattern 46 is obtained. Consequently, the closed loop removal pattern 53 of this embodiment partly having the oblique edge portion 52 crossing obliquely at an angle of 45° with respect to the length direction of the line portion 41a is formed. That is, the closed loop removal pattern 53 shown in FIG. 18 is a trimming pattern of this embodiment. Subsequent processes are the same as the third embodiment.

As described above, according to the fourth embodiment, the same effect as the first to third embodiments can be obtained. When a mask pattern is produced with an electronic line drawing unit for drawing a pattern using variable shaped beam (VSB), oblique line data except a 45° oblique line is usually handled as staircase data in a minimum grid. Thus, if other oblique line portions except the 45° oblique line is contained in the mask pattern, the risk of the data amount being increased enormously is raised. According to this embodiment, the angle of the oblique edge portion 52 is set to 45°. Consequently, although the data amount of the entire pattern is increased slightly as compared with the third embodiment, the data amount for drawing with VSB can be compressed largely as compared with the third embodiment. As a result, the production efficiency of the pattern and manufacturing efficiency of the semiconductor device can be improved further.

Although detailed description accompanied by representation is omitted, the pattern creation method of this embodiment can be executed appropriately by operating the pattern creating device capable of executing the pattern creation method of this embodiment according to the pattern creation program which can make the pattern creating device execute the pattern creation method of this embodiment.

FIFTH EMBODIMENT

Next, a fifth embodiment of the present invention will be described with reference to FIGS. 19, 20A, and 20B. In the meantime, like reference numerals are attached to the same components as the first to fourth embodiments and detailed description thereof is omitted.

In this embodiment, technology of creating the oblique edge by grinding a pattern of a predetermined shape from a corner portion of the cover pattern composed of mainly the staircase shaped portion, different from the third and fourth embodiments, will be described.

Figure 19:
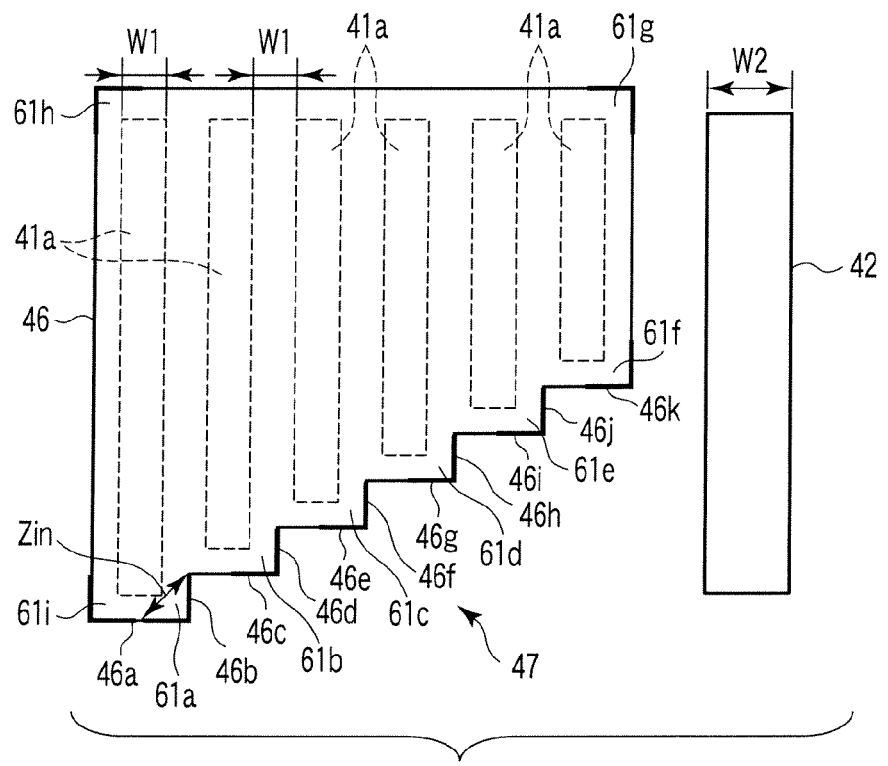
FIG. 19 is a plan view showing a pattern creation process in a pattern creation method according to a fifth embodiment.

As shown in FIG. 19, all corner portions 61a, 61b, 61c, 61d, 61e, 61f, 61g, 61h, 61i possessed by the cover pattern 46 as well as the corner portions 61a, 61b, 61c, 61d, 61e, 61f of the staircase shaped portion 47 of the cover pattern 46 are subjected to rule check. In this embodiment, the rule check is carried out using Winner_check indicated with an arrow Zin in FIG. 19 instead of the Wouter_check used in the third and fourth embodiments. More specifically, as shown with a bold solid line in FIG. 19, data of two sides of the same length perpendicular to each other is extracted such that a diagonal line connecting the two sides is less than the Winner_check amount, from all the edge portions of the cover pattern 46 which sandwich the respective corner portions 61a to 61i such as the edge portions 46a to 46k. The Winner_check amount of this embodiment is set to a size √2 times the length Y of the edge portions 46b, 46d, 46f, 46h, 46j which is the height of each step of the staircase shaped portion 47, like the Wouter_check amount of the fourth embodiment.

Figure 20A:
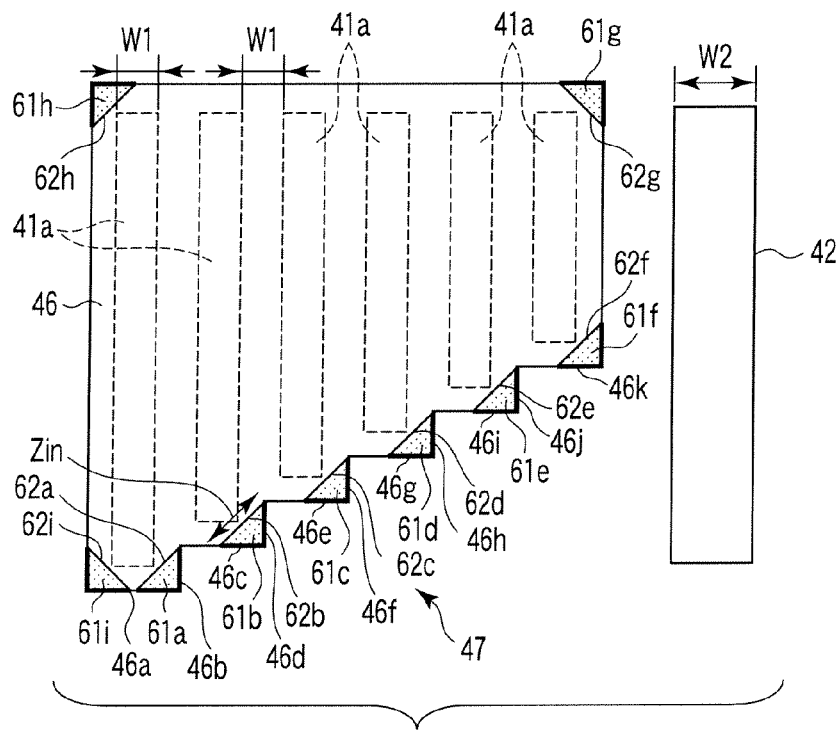
FIGS. 20A and 20B are plan views showing the pattern creation process in the pattern creation method according to the fifth embodiment.

Next, as shown by a dotted portion in FIG. 20A, data of plural triangular patterns (inscribing patterns) 62a, 62b, 62c, 62d, 62e, 62f, 62g, 62h, 62i which connect two sides sharing the position of an end portion while contacting (inscribing) all the corner portions 61a to 61i of the cover pattern 46, such as the corner portions 61a to 61f of the staircase shaped portion 47, is extracted about each side extracted in the above-described step. According to the above-mentioned setting, the triangular patterns 62a to 62i extracted in this embodiment have two sides having the same length as the edge portions 46b, 46d, 46f, 46h, 46j while sandwiching the right angle corner portions 61a to 61i. The triangular patterns have a remaining side having a length √2 times each of these sides and crossing obliquely at 45° with respect to the length direction of each line portion 41a.

Thus, the triangular patterns 62a, 62b, 62c, 62d, 62e, 62f, 62g, 62h, 62i of this embodiment are rectangular equilateral triangles having the same size and shape as the triangular patterns 51a to 51e of the fourth embodiment. Like the triangular patterns 51a to 51e of the fourth embodiment, of three sides of each of the rectangular equilateral triangles 62a to 62i, the length of an oblique side crossing obliquely at 45° with respect to the length direction of the line portion 41a, indicated with Zin in FIGS. 19 and 20A is set to a smaller value than 2W1.

Figure 20B:
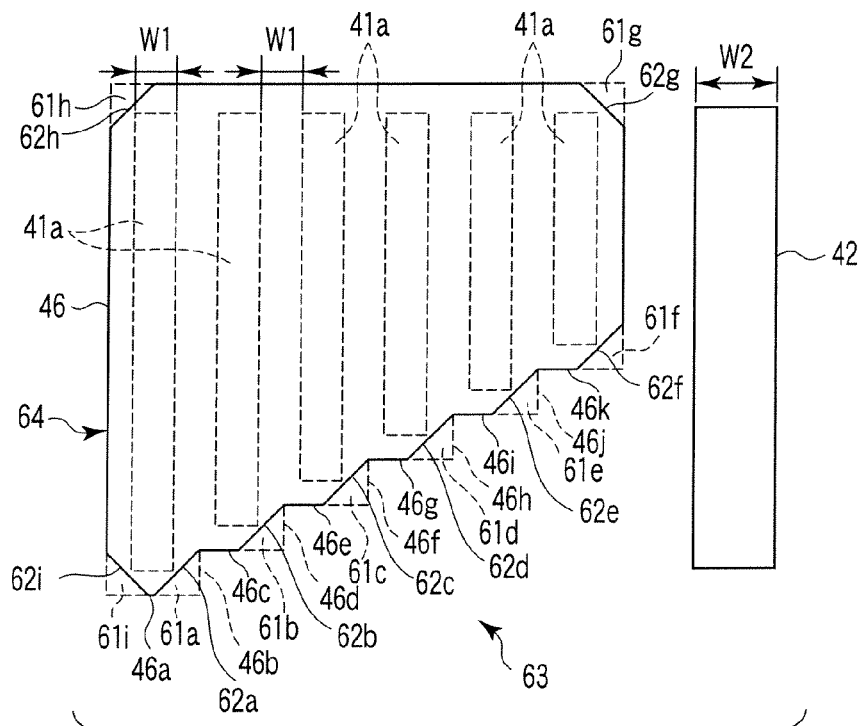

Next, as shown in FIG. 20B, the respective rectangular equilateral triangle patterns 62a to 62i created in the above-described process are cut out from the cover pattern 46. More specifically, a logical difference between data of a group of the respective rectangular equilateral triangle patterns 62a to 62i and data of the cover pattern 46 is obtained. Consequently, a closed loop removal pattern 64 of this embodiment partly having an edge portion 63 crossing obliquely at 45° with respect to the length direction of the line portion 41a is formed. In other words, the closed loop removal pattern 64 shown in FIG. 20B is a trimming pattern of this embodiment. Subsequent process is the same as the third embodiment described previously.

As described above, according to the fifth embodiment, the same effect as the first to fourth embodiments can be obtained. According to this embodiment, the oblique edge portion 63 which is smaller than the cover pattern 46 is formed different from the third and fourth embodiments of forming the oblique edge portions 49, 52 larger than the cover pattern 46. The oblique edge portion formation processing of the third and fourth embodiments contains some aspects of excessive setting in terms of overlay tolerance. Contrary to this, in the oblique edge portion formation processing of this embodiment, as described above, the closed loop removal pattern 64 is formed by subtracting the respective rectangular equilateral triangle patterns 62a to 62i formed by Winner_check from the original cover pattern 46. Therefore, according to this embodiment, the handled data amount can be reduced as compared with the third and fourth embodiments. Consequently, the creation efficiency of the pattern and the manufacturing efficiency of the semiconductor device can be improved further.

Although detailed description accompanied by representation is omitted, the pattern creation method of this embodiment can be executed appropriately by operating the pattern creating device capable of executing the pattern creation method of this embodiment according to the pattern creation program which can make the pattern creating device execute the pattern creation method of this embodiment.

SIXTH EMBODIMENT

Next, a sixth embodiment of the present invention will be described with representation by drawings omitted. Like reference numerals are attached to the same components as the first to fifth embodiments and detailed description thereof is omitted.

In this embodiment, the technology of creating an exposure mask based on design data of a pattern created using technology of at least an embodiment of the first to fifth embodiments will be described.

First, design data of a desired integrated circuit pattern 3, 41, for example, the semiconductor circuit is created using at least an embodiment of the first to fifth embodiments. Subsequently, a mask pattern is created on an exposure mask (not shown) based on this design data. This exposure mask is a mask original plate created by forming a film having a smaller transmittance to exposure wavelength than the substrate, on the substrate almost transparent to the exposure wavelength. Then, the mask pattern is formed on the exposure mask by drawing a mask pattern on the film based on the design data of the integrated circuit pattern 3, 41. Consequently, the exposure mask having a desired mask pattern can be formed.

As described above, the sixth embodiment uses the technology according to at least one of the first to fifth embodiments. Consequently, the fine integrated circuit pattern 3, 41 such as various semiconductor devices, interconnects using the sidewall leaving process can be formed on the exposure mask accurately, effectively and easily. Thus, the exposure mask for the sidewall leaving process having improved accuracy, reliability and quality can be manufactured effectively and easily.

SEVENTH EMBODIMENT

Next, a seventh embodiment of the present invention will be described with reference to FIGS. 21A and 21B. In the meantime, like reference numerals are attached to the same components as the first to sixth embodiments and detailed description thereof is omitted.

In this embodiment, technology of manufacturing a semiconductor device using an exposure mask produced using the technology of the sixth embodiment will be described. More specifically, technology of forming a NAND flash memory gate electrode which is a kind of a nonvolatile semiconductor memory device using the exposure mask of the sixth embodiment will be described.

Figure 21A:
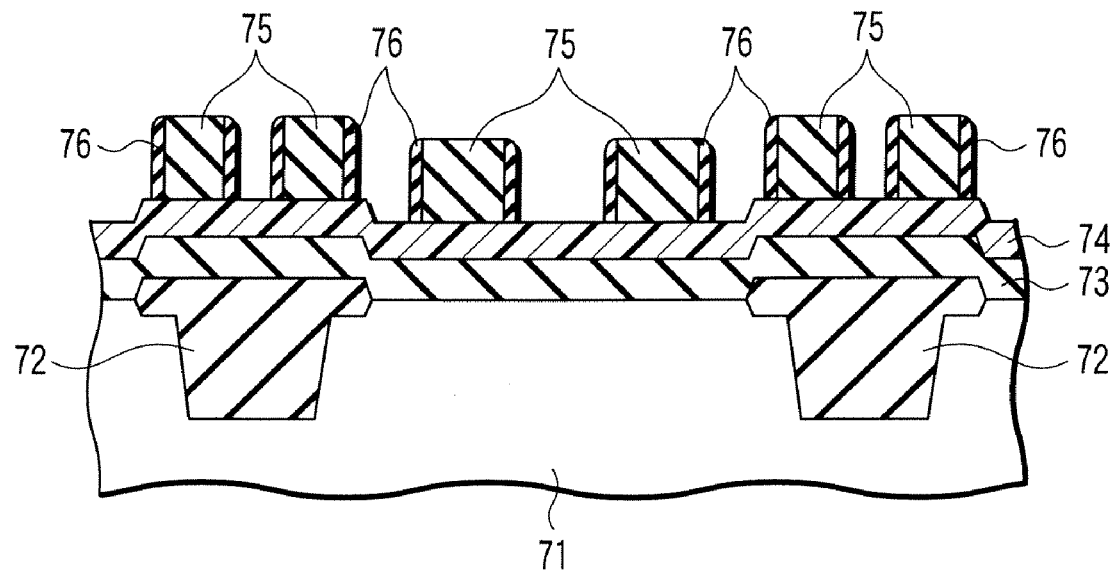
FIGS. 21A and 21B are sectional views showing a method of manufacturing a semiconductor device according to a seventh embodiment.

As shown in FIG. 21A, a gate insulation film 73 is provided as a first lower layer material covering a STI area 72 serving as a device separation area formed on the surface of a semiconductor substrate 71 and the front layer of the semiconductor substrate 71 as a processing object substrate. The semiconductor substrate 71 is formed of for example silicon wafer. Subsequently, a hard mask 74 is provided as a second lower layer material on the gate insulation film 73. The hard mask 74 is formed of for example, a silicon nitride film (SiN). Subsequently, a sacrifice film 75 is provided on the hard mask 74, the sacrifice film 75 serving as the basic pattern 44. The sacrifice film 75 is composed of for example, amorphous silicon (a-Si).

Next, a photosensitive resin film is provided as a resist film by covering the sacrifice film 75 although not shown. Subsequently, exposure processing is carried out using an exposure device (not shown) and an exposure mask of the sixth embodiment, so that a mask pattern as a pattern of the semiconductor circuit original plate formed on this exposure mask is transferred to the photosensitive resin film. Subsequently, by developing the photosensitive resin film to which the mask pattern is transferred, resist pattern corresponding to the mask pattern is formed on the photosensitive resin film. A pattern of the desired semiconductor circuit original plate is formed on the resist film through these steps.

Next, the sacrifice film 75 is etched based on a pattern of the semiconductor circuit original plate formed on the resist film and patterned to a predetermined shape. Subsequently, a sidewall material 76 which turns to a sidewall pattern 45 is provided by surrounding the sidewall portion of the patterned sacrifice film 75. The sidewall material 76 is formed of for example, a TEOS film. Subsequently, the side material 76 is patterned to a predetermined shape according to for example, RIE method. Then, the sacrifice film 75 is peeled from the hard mask 74 and removed. Subsequently, with the sidewall material 76 serving as the sidewall pattern 45 left on the hard mask 74 as a mask, the hard mask 74 is patterned to a predetermined shape according to for example, RIE method. Then, the patterned hard mask 74 is slimmed using for example, phosphoric acid ($H_3PO_4$). With the slimmed hard mask 74 and sidewall material 76 as a mask, the gate insulation film 73 is patterned to a predetermined shape according to for example, RIE method. Consequently, major patterns of gate electrode having a desired structure are formed. Then, the sidewall material 76 and the hard mask 74 are peeled from the surface of the semiconductor substrate 71 and removed therefrom.

Figure 21B:
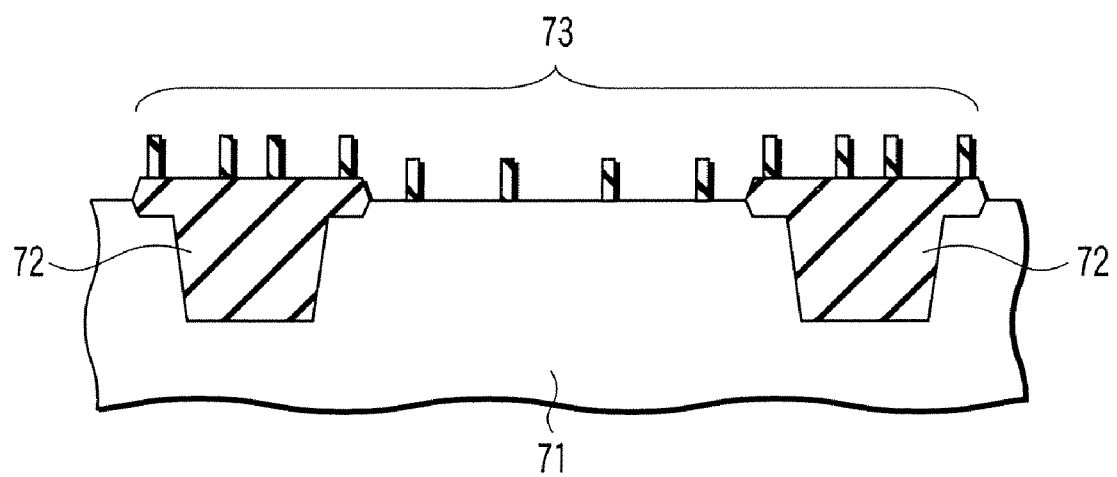
Figure 22:
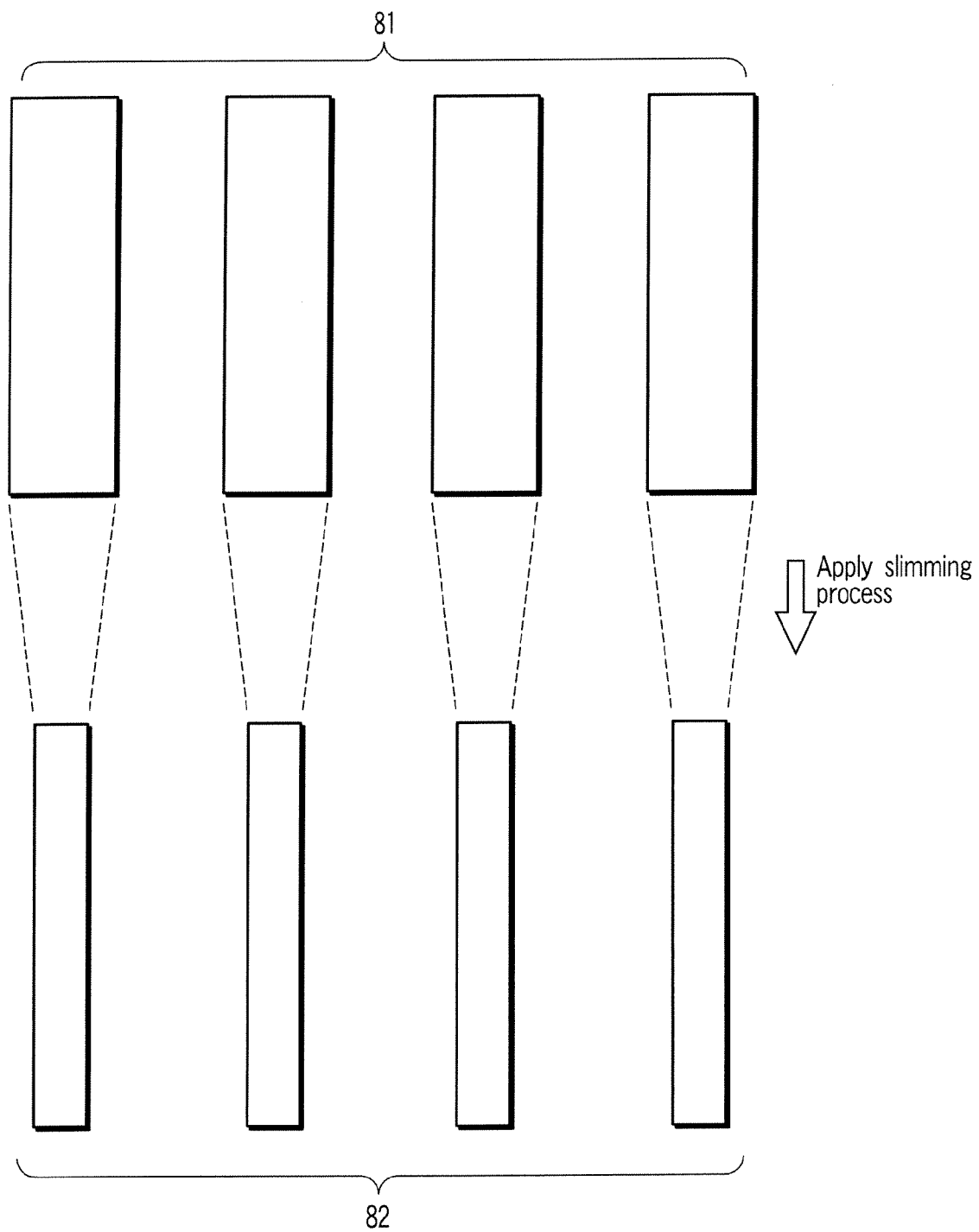
FIG. 22 is a plan view showing a pattern creation process in a modification of the pattern creation method according to the third embodiment.

As a result of the above-described process, as shown in FIG. 21B, the patterned gate insulation film 73 is left as major pattern of the gate electrode having the desired structure. The respective gate insulation film 73 is formed into the same pattern as the sidewall pattern. By providing an electrode material for the gate electrode, a NAND flash memory can be manufactured.

As described above, according to the seventh embodiment, pattern exposure is carried out using the exposure mask for the sidewall leaving process of the sixth embodiment. Consequently, the pattern of the fine semiconductor integrated circuit can be transferred onto the semiconductor substrate 71 at a high accuracy effectively and easily by adopting the sidewall leaving process. The pattern of the fine semiconductor integrated circuit containing various semiconductor devices and interconnects can be formed on the semiconductor substrate 71 at a high accuracy effectively and easily by adopting the sidewall leaving process. That is, a high quality semiconductor device having improved performance, reliability, quality and yield, including the semiconductor substrate in which the fine semiconductor integrated circuit pattern is formed at a high accuracy, can be manufactured effectively and easily by adopting the sidewall leaving process.

Generally, the dimensions in the vicinity of the gate electrode are determined by only the thickness of the sidewall material 76, not depending on the processing dimension of lithography process. Thus, the pattern formation method of this embodiment ensures a higher dimension controllability. Further, according to this embodiment, line width roughness (LWR), which is an index of dispersion of dimensions of line widths of various patterns such as the gate electrode pattern can be reduced.

The pattern creation method, pattern creation program, mask manufacturing method and semiconductor device manufacturing method of the present invention are not restricted to the first to seventh embodiments described above. The present invention can be carried out by changing part of the structure or the manufacturing process partly in various ways or combining various settings appropriately within the scope not departing from the spirit of the present invention.

For example, the angle of the oblique side of the triangular patterns 48a to 48e, 51a to 51e, 61a to 61e created according to the third to fifth embodiments does not always need to be set to 45°. The angle of the oblique side of the respective triangular patterns 48a to 48e, 51a to 51e, 61a to 61e may be set to for example, 60° or 30°.

In the first to seventh embodiments, of the two kinds of the sidewall leaving processes, i.e., line sidewall leaving process and space sidewall leaving process, a case of using the line sidewall leaving process has been described. However in the first to seventh embodiments, needless to say, the space sidewall leaving process may be adopted instead of the line sidewall leaving process. Particularly in the trimming process of the third to fifth embodiments, data of the trimming pattern may be adopted for surplus pattern data generated using the space sidewall leaving process instead of the line sidewall leaving process. Hereinafter, technology for producing a pattern by adopting the space sidewall leaving process and removing the surplus pattern from this pattern by trimming will be described with reference to FIGS. 22 to 25.

First, a processing object film which turns to an integrated circuit pattern later and a material of the first hard mask are deposited successively on the semiconductor substrate. Subsequently, as shown on the upper level of FIG. 22, a resist film is provided on the material of the first hard mask and a plurality of resist patterns 81 are formed in the resist film by lithography process. After each resist pattern 81 is formed, a plurality of first hard mask patterns 82 are formed by etching the first hard mask using the resist pattern 81 as a mask as shown on the lower level of FIG. 22. As shown by an outline arrow in FIG. 22, by adopting slimming process to the resist pattern 82 or the first hard mask pattern 82, the first hard mask pattern 82 is shaped into a finer pattern than the limit of resolution of lithography process. Subsequently, the resist film 81 as a resist pattern is peeled from the first hard mask pattern 82 shaped into the fine pattern.

Figure 23A:
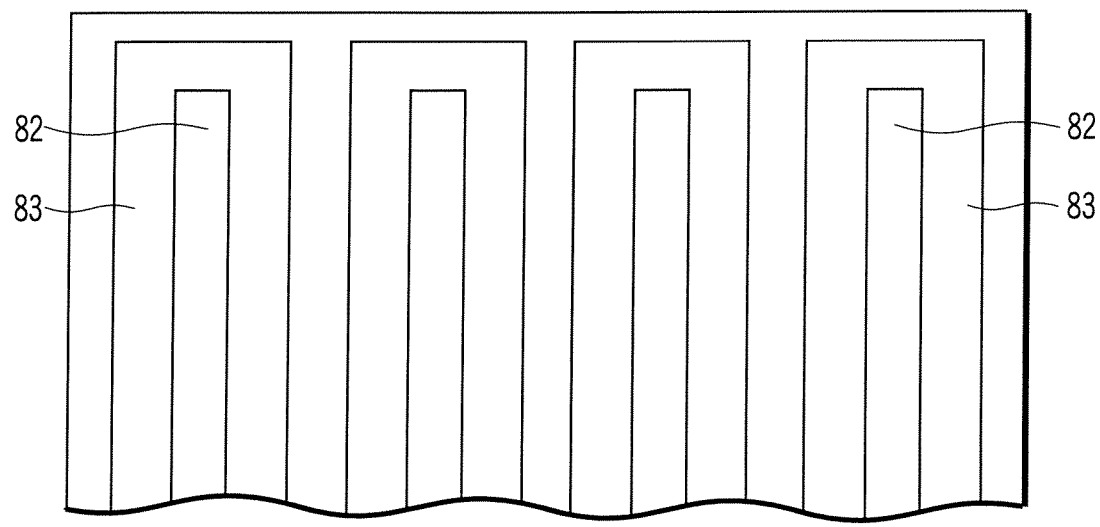
FIGS. 23A and 23B are plan views showing the pattern creation process in the modification of the pattern creation method according to the third embodiment.

Next, a film 83 which turns to the sidewall pattern later is deposited on a processing object film 85 by covering the first hard mask pattern 82. Subsequently, after the film 83 is ground up to a height of the first hard mask pattern 82 according to the CMP method or the like, the film 83 is patterned according to the RIE method or the like. Consequently, as shown in FIG. 23A, the plurality of sidewall patterns 83 are formed by surrounding the sidewall portion of the first hard mask pattern 82.

Figure 23B:
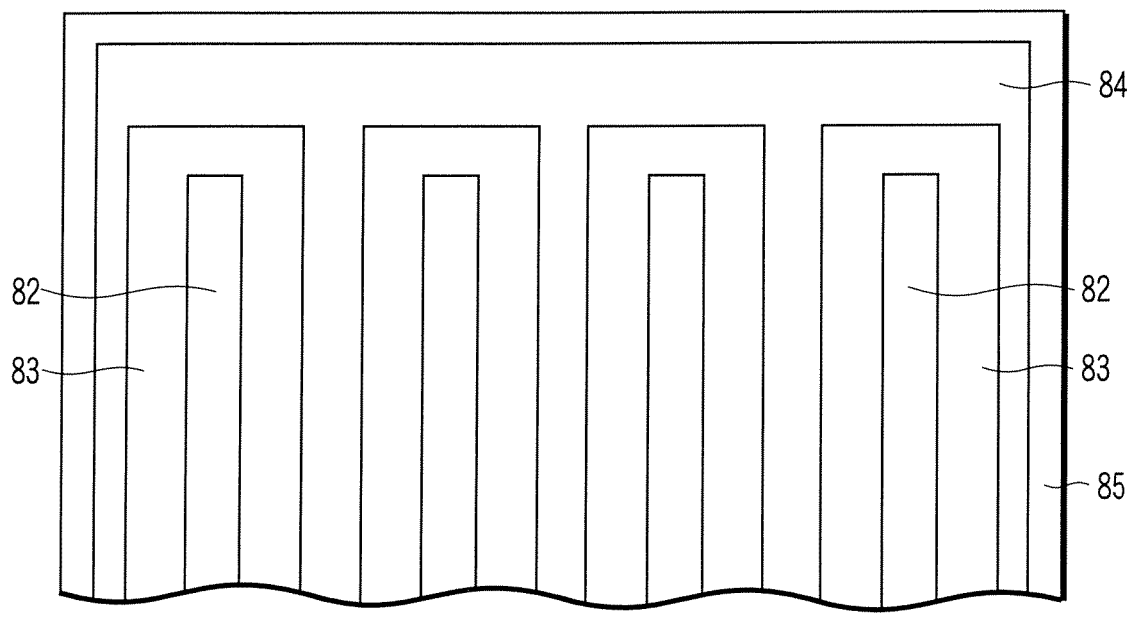

Next, a second hard mask material 84 is deposited on the processing object film 85 by covering the first hard mask pattern 82 and the sidewall pattern 83. Subsequently, the second hard mask material 84 is ground up to about the height of the first hard mask pattern 82 and the sidewall pattern 83 according to the CMP method or the like. Consequently, as shown in FIG. 23B, the second hard mask material 84 is left around the sidewall pattern 83 while the second hard mask material 84 is buried into a space portion between the sidewall patterns 83.

Figure 24:
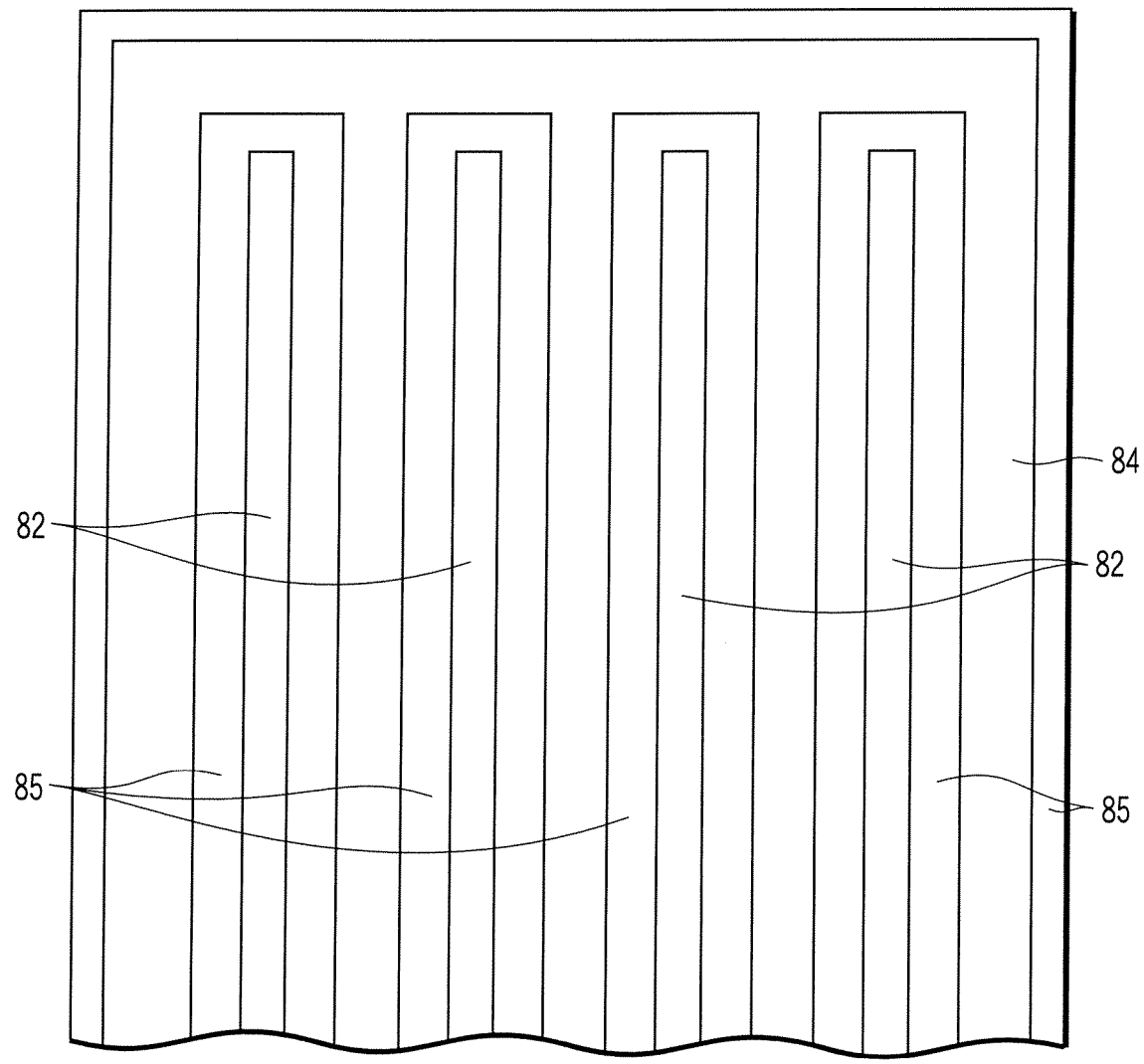
FIG. 24 is a plan view showing the pattern creation process in the modification of the pattern creation method according to the third embodiment.

Next, as shown in FIG. 24, the first hard mask pattern 82 and the second hard mask material 84 are left on the processing object film 85 by peeling the sidewall pattern 83 on the processing object film 85. The second hard mask material 84 left on the processing object film 85 turns to a second hard mask pattern. Particularly, the second hard mask material 84 left between the sidewall patterns 83 is called space sidewall pattern. The method of leaving the space sidewall pattern 84 between the sidewall patterns 83 is called space sidewall leaving process. Then, in this space sidewall leaving process, space in contact with the sidewall portion of the resist pattern formed in the lithography process turns to space of a design pattern.

Figure 25:
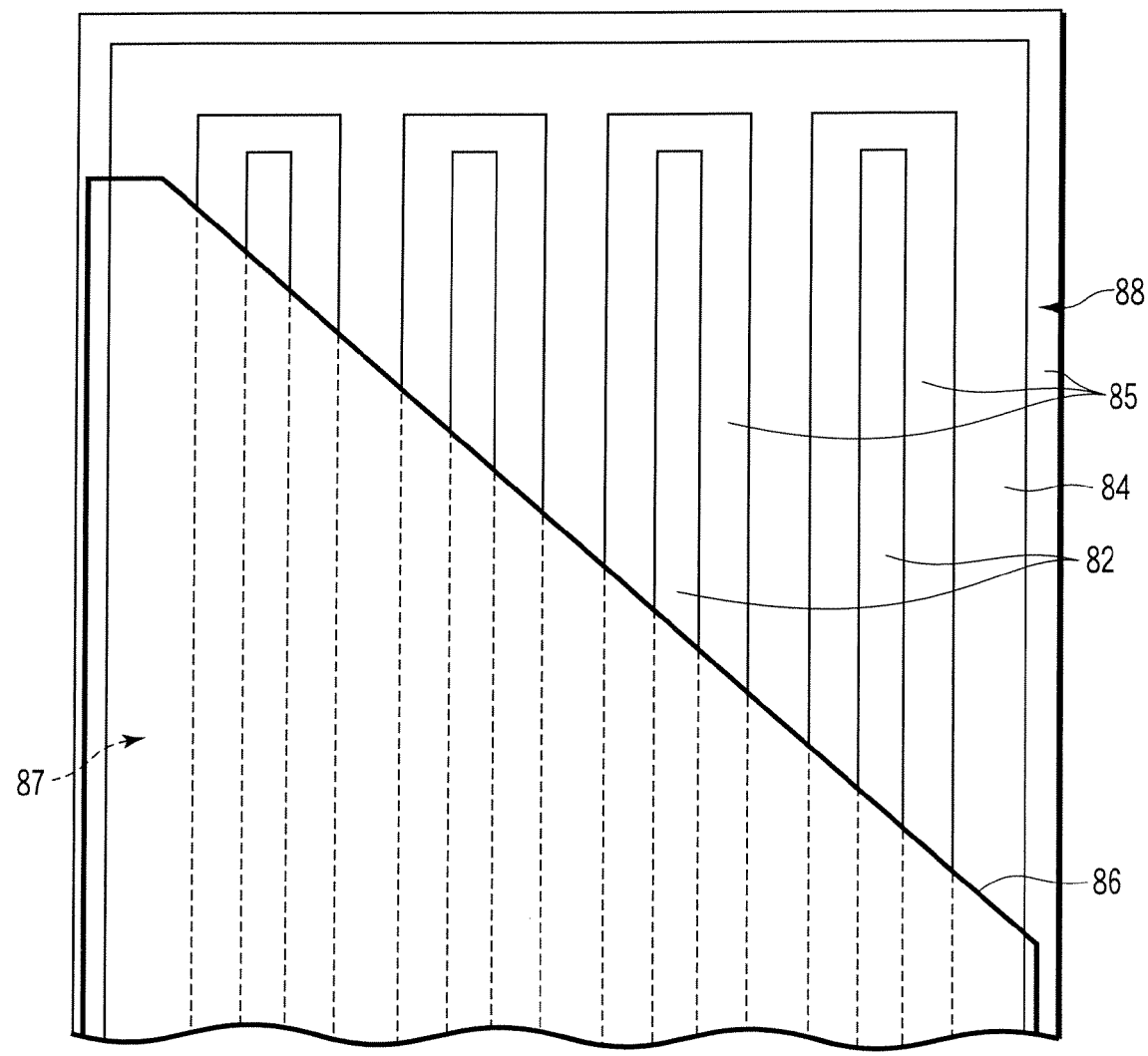
FIG. 25 is a plan view showing the pattern creation process in the modification of the pattern creation method according to the third embodiment.
Figure 26A:
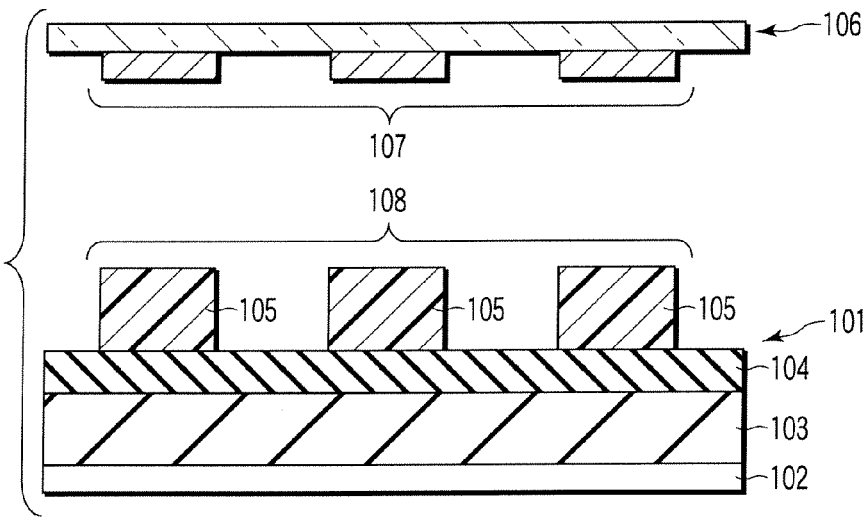
FIGS. 26A, 26B, 26C, 26D and 26E are plan views showing a pattern creation process using the line sidewall leaving process according to the related art.
Figure 26B:
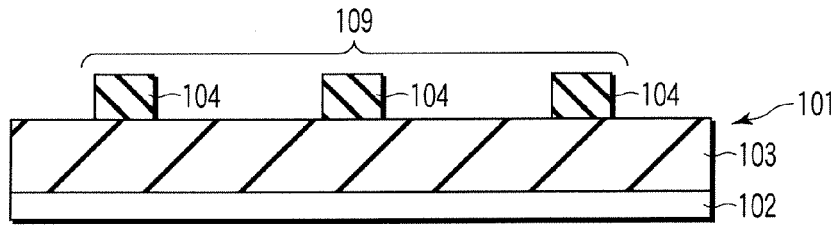
Figure 26C:
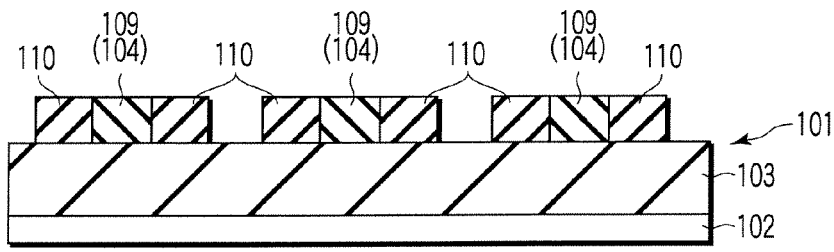
Figure 26D:
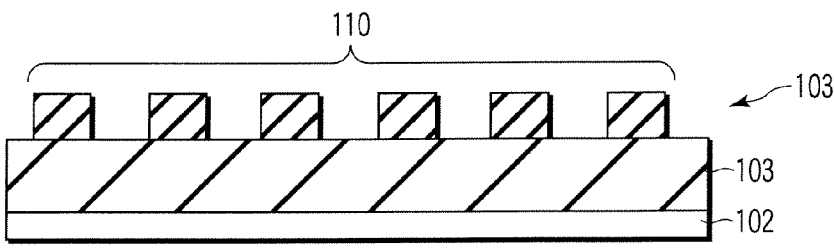
Figure 26E:
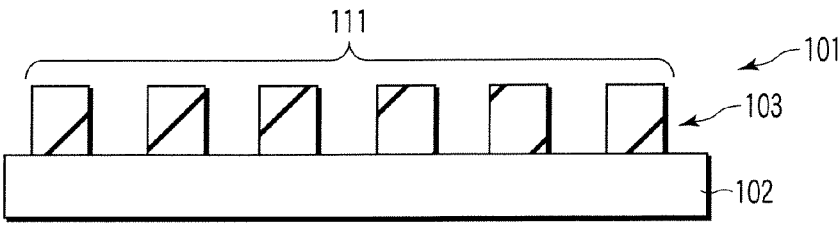
Figure 27A:
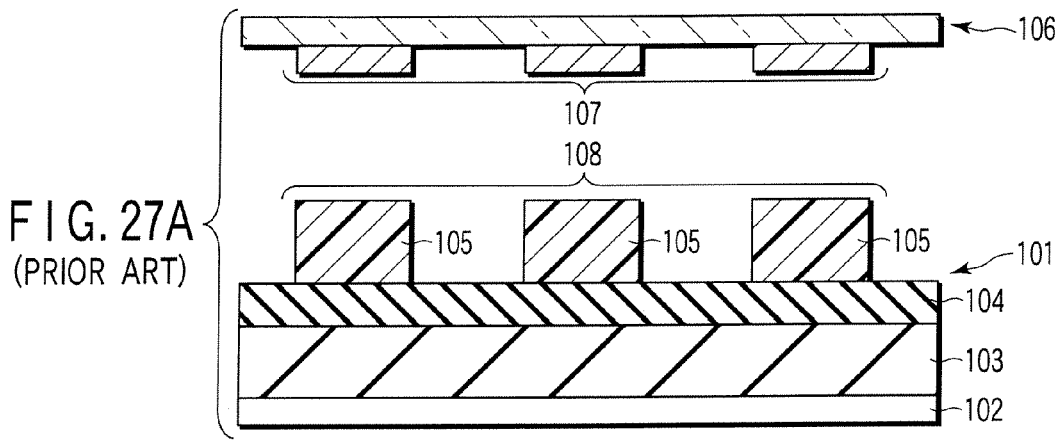
FIGS. 27A, 27B, 27C, 27D, 27E and 27F are plan views showing a pattern creation process using the space sidewall leaving process according to the related art.
Figure 27B:
Figure 27C:
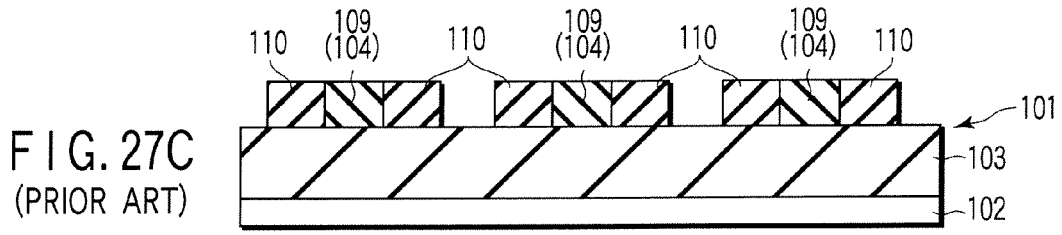
Figure 27D:
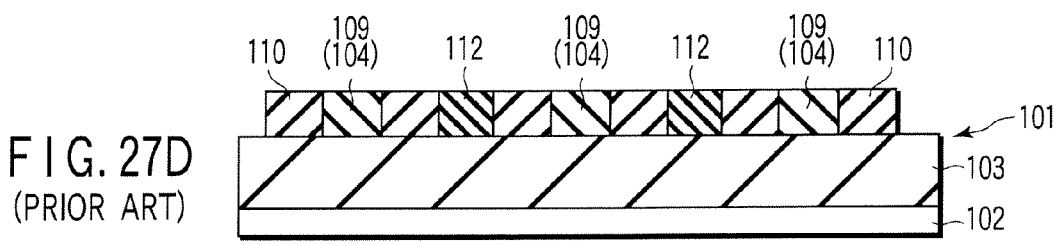
Figure 27E:
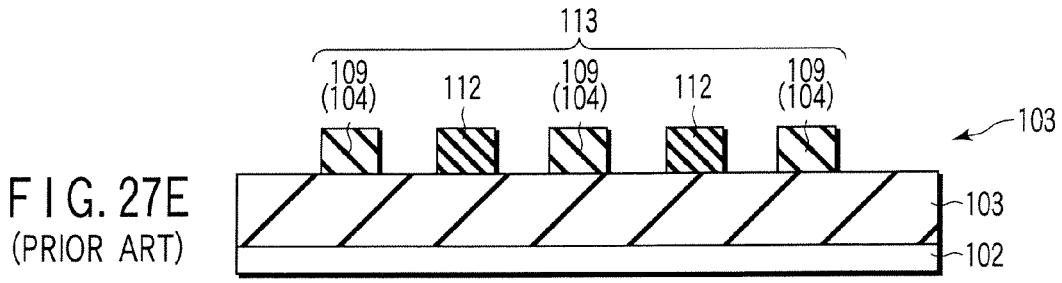
Figure 27F:
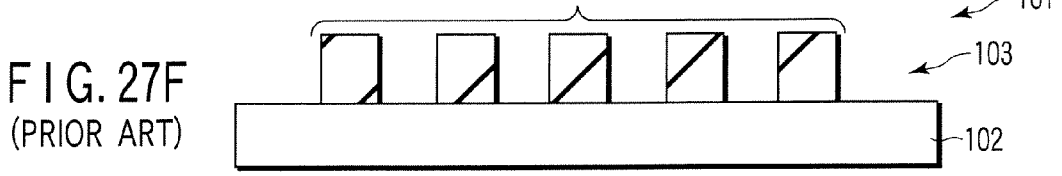

Next, as shown in FIG. 25, a trimming pattern 86 is provided by covering a portion 87 scheduled to be left ultimately on the substrate in the first hard mask pattern 82 and the second hard mask pattern 84 left on the processing object film 85. Subsequently, although not shown, a surplus pattern 88 exposed from the trimming pattern 86 of the first hard mask pattern 82 and the second hard mask pattern 84 is removed from the processing object film 85 by etching or the like. Then, the processing object film 85 as the fundamental film is etched with the first hard mask pattern 82 and the second hard mask pattern 84 from which the surplus pattern 88 has been removed by the trimming process adopted as a mask. Although not shown, a desired integrated circuit pattern is formed of the processing object film 85 on the semiconductor substrate by the above-descried process. After the integrated circuit pattern is formed, the first hard mask pattern 82 and the second hard mask pattern 84 on the processing object film 85 are peeled and removed.

In the trimming process of the third to fifth embodiments, there is no problem in generating trimming data for the surplus pattern data generated using the space sidewall leaving process instead of the line sidewall leaving process. Needless to say, the space sidewall leaving process described above can be replaced with data creation process for the mask pattern data as it is like the third to fifth embodiments using the line sidewall leaving process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern creation method, comprising: by a computer:
   laying out data of a most extreme end pattern located at the most extreme end of a plurality of integrated circuit patterns arranged in line on a processing object substrate on a first layer, and laying out data of said each integrated circuit pattern other than the most extreme end pattern on a second layer;
   extracting data of a first most proximate pattern which is most proximate to the most extreme end pattern of said each integrated circuit pattern except the most extreme end pattern from the second layer and converting data of the extracted first most proximate pattern from the second layer to a third layer;

generating data of a contacting pattern which contacts both the first most proximate pattern whose data is converted to the third layer and the most extreme end pattern in a fourth layer;

generating data of a non-overlapping pattern which is the contacting pattern whose data is generated in the fourth layer, excluding a portion which overlaps the most extreme end pattern and the first most proximate pattern whose data is converted to the third layer, in a fifth layer;

extracting data of a second most proximate pattern which is most proximate to the non-overlapping pattern whose data is generated in the fifth layer of said each integrated circuit pattern whose data is laid out in the second layer and converting data of the extracted second most proximate pattern from the second layer to the first layer; and repeating from a step of extracting data of the first most proximate pattern from the second layer and converting the data to the third layer to a step of extracting data of the second most proximate pattern from the second layer and converting the data to the first layer with respect to all data of said each integrated circuit pattern.

2. The method according to claim 1, further comprising:

forming at least a sidewall pattern so as to surround sidewall portions at least one of a plurality of basic patterns which serve as a fundamental for a plurality of the integrated circuit patterns; and processing members located below with the sidewall patterns as a mask, processing the members located below with a space sidewall pattern provided between said each sidewall pattern and said each basic pattern as a mask, or processing members located below with the space sidewall pattern provided adjacent to the sidewall pattern and said each basic pattern used as a mask.

3. The method according to claim 2, further comprising: by the computer:

extracting data of an integrated circuit pattern formed using the sidewall pattern of said each integrated circuit pattern from data of said each integrated circuit pattern and generating data of the sidewall pattern corresponding to the extracted data according to the pattern creation method;

generating data of a cover pattern formed partly into a staircase shape by covering a portion which is formed into a staircase shape extended or contracted as it goes from one side to the other side along a direction of arrangement of the integrated circuit pattern of the sidewall patterns corresponding to the generated data and left on the processing object substrate and the basic pattern which is formed into the staircase shape and surrounded by the portion left on the processing object substrate; and extracting data of plural sides containing each corner portion of the staircase shaped portion of the cover pattern and performing a process for smoothing the corner portions.

4. The method according to claim 3, wherein the smoothing process for the corner portions further comprising: by the computer:

extracting data of plural sides containing each corner portion of the staircase shaped portion of the cover pattern and generating data of any of a triangular pattern which contains two sides adjacent to each other of said each side corresponding to said each extracted data while circumscribing the staircase shaped portion, an isosceles triangle pattern which uses a shorter side of the two sides adjacent to each other as a side while circumscribing the staircase shaped portion and an isosceles triangle pattern which uses a shorter side of the two sides adjacent to each other as a side while inscribing the staircase shaped portion; and adopting any one of a logical sum of data of the triangular pattern which circumscribes the generated staircase shaped portion and data of the cover pattern, a logical sum of data of the isosceles triangle shaped pattern which circumscribes the generated staircase shaped portion and data of the cover pattern and a logical difference of data of the isosceles triangle shaped pattern which inscribes the generated staircase shaped portion and data of the cover pattern.

5. The method according to claim 2, further comprising: by the computer:

distinguishing data of a pattern adopting the sidewall leaving process of data of said each integrated circuit pattern from data of a pattern not adopting the sidewall leaving process; and distinguishing a pattern adopting the sidewall leaving process from a pattern not adopting the sidewall leaving process based on said each distinguished data so as to extract data of a pattern to be formed using the sidewall pattern from data of said each integrated circuit pattern.

6. The method according to claim 2, wherein after a predetermined area is specified from the entire integrated circuit pattern, data of a pattern adopting the sidewall leaving process is extracted, by the computer, from the area or data of a pattern not adopting the sidewall leaving process is not extracted.

7. The method according to claim 2, further comprising: by the computer:

extracting data of a pattern adopting the sidewall leaving process from said each integrated circuit pattern depending on whether or not the width thereof satisfies a predetermined size.

8. The method according to claim 1, wherein in a cycle after a second one of cycles for repeating processing from a step of extracting data of the first most proximate pattern from the second layer and converting the data to the third layer to a step of extracting data of the second most proximate pattern from the second layer and converting the data to the first layer until this processing is carried out to all data of said each integrated circuit pattern, the second most proximate pattern obtained by extracting the data from the second layer and converting it to the first layer is used as the most extreme end pattern.

9. The method according to claim 1, wherein when the data of the integrated circuit pattern adjacent to the second most proximate pattern does not exist in the second layer although the data of the second most proximate pattern which is converted from the second layer to the first layer exists, after data of a dummy pattern of the integrated circuit pattern is generated in the second layer in a pseudo way such that the dummy pattern is adjacent to the second most proximate pattern, processing from a step of extracting data of the first most proximate pattern from the second layer and converting the data from the second layer to the third layer up to a step of generating data of the non-overlapping pattern in a fifth layer is executed.

10. The method according to claim 1, wherein when the data of the integrated circuit pattern adjacent to the second most proximate pattern does not exist in the second layer although the data of the second most proximate pattern which is converted from the second layer to the first layer exists, pattern correction is performed on a portion on an opposite side to a side adjacent to the non-overlapping pattern of the second most proximate pattern so that the second most proximate pattern has the same size and shape as the non-overlapping pattern.

11. The method according to claim 1, further comprising: by the computer:
when the most extreme end pattern is different from the first most proximate pattern in size and shape, generating data of a pattern which contains any larger pattern of the most extreme end pattern and the first most proximate pattern while contacting both the most extreme end pattern and the first most proximate pattern as data of the contacting pattern in the fourth layer; and
generating data of a pattern which is the contacting pattern excluding an overlapping portion which overlaps both the most extreme end pattern and the first most proximate pattern as data of the non-overlapping pattern in the fifth layer.

12. The method according to claim 1, further comprising:
forming a plurality of the non-overlapping patterns and, by the computer, correcting data of said each non-overlapping pattern so that the size of the width of said each non-overlapping pattern and the size of the width between said each non-overlapping pattern is in a relation of 1:1±20%.

13. A mask manufacturing method for forming a mask pattern based on pattern data created using a pattern creation method on a mask, comprising: by the computer:
laying out data of a most extreme end pattern located at the most extreme end of a plurality of integrated circuit patterns arranged in line on a processing object substrate on a first layer, and laying out data of said each integrated circuit pattern other than the most extreme end pattern on a second layer;
extracting data of a first most proximate pattern which is most proximate to the most extreme end pattern of said each integrated circuit pattern except the most extreme end pattern from the second layer and converting data of the extracted first most proximate pattern from the second layer to a third layer;
generating data of a contacting pattern which contacts both the first most proximate pattern whose data is converted to the third layer and the most extreme end pattern in a fourth layer;
generating data of a non-overlapping pattern which is the contacting pattern whose data is generated in the fourth layer, excluding a portion which overlaps the most extreme end pattern and the first most proximate pattern whose data is converted to the third layer, in a fifth layer;
extracting data of a second most proximate pattern which is most proximate to the non-overlapping pattern whose data is generated in the fifth layer of said each integrated circuit pattern whose data is laid out in the second layer and converting data of the extracted second most proximate pattern from the second layer to the first layer; and
repeating from a step of extracting data of the first most proximate pattern from the second layer and converting the data to the third layer to a step of extracting data of the second most proximate pattern from the second layer and converting the data to the first layer with respect to all data of said each integrated circuit pattern.

14. The method according to claim 13, wherein the pattern creation method further comprising:
forming at least a sidewall pattern so as to surround sidewall portions at least one of a plurality of basic patterns which serve as a fundamental for a plurality of the integrated circuit patterns; and
processing members located below with the sidewall patterns as a mask, processing the members located below with a space sidewall pattern provided between said each sidewall pattern and said each basic pattern as a mask, or processing members located below with the space sidewall pattern provided adjacent to the sidewall pattern and said each basic pattern used as a mask.

15. The method according to claim 14, further comprising: by the computer:
extracting data of an integrated circuit pattern formed using the sidewall pattern of said each integrated circuit pattern from data of said each integrated circuit pattern and generating data of the sidewall pattern corresponding to the extracted data according to the pattern creation method;
generating data of a cover pattern formed partly into a staircase shape by covering a portion which is formed into a staircase shape extended or contracted as it goes from one side to the other side along a direction of arrangement of the integrated circuit pattern of the sidewall patterns corresponding to the generated data and left on the processing object substrate and the basic pattern which is formed into the staircase shape and surrounded by the portion left on the processing object substrate; and
extracting data of plural sides containing each corner portion of the staircase shaped portion of the cover pattern and performing a process for smoothing the corner portions.

16. The method according to claim 15, wherein the smoothing process for the corner portions further comprising: by a computer:
extracting data of plural sides containing each corner portion of the staircase shaped portion of the cover pattern and generating data of any of a triangular pattern which contains two sides adjacent to each other of said each side corresponding to said each extracted data while circumscribing the staircase shaped portion, an isosceles triangle pattern which uses a shorter side of the two sides adjacent to each other as a side while circumscribing the staircase shaped portion and an isosceles triangle pattern which uses a shorter side of the two sides adjacent to each other as a side while inscribing the staircase shaped portion; and
adopting any one of a logical sum of data of the triangular pattern which circumscribes the generated staircase shaped portion and data of the cover pattern, a logical sum of data of the isosceles triangle shaped pattern which circumscribes the generated staircase shaped portion and data of the cover pattern and a logical difference of data of the isosceles triangle shaped pattern which inscribes the generated staircase shaped portion and data of the cover pattern.

17. A semiconductor device manufacturing method for forming integrated circuit patterns on a semiconductor substrate using a mask substrate manufactured according to a mask manufacturing method for forming a mask pattern based on pattern data created using a pattern creation method on a mask, comprising: by a computer:
laying out data of a most extreme end pattern located at the most extreme end of a plurality of integrated circuit patterns arranged in line on a processing object substrate on a first layer,
and laying out data of said each integrated circuit pattern other than the most extreme end pattern on a second layer;

extracting data of a first most proximate pattern which is most proximate to the most extreme end pattern of said each integrated circuit pattern except the most extreme end pattern from the second layer and converting data of the extracted first most proximate pattern from the second layer to a third layer;

generating data of a contacting pattern which contacts both the first most proximate pattern whose data is converted to the third layer and the most extreme end pattern in a fourth layer;

generating data of a non-overlapping pattern which is the contacting pattern whose data is generated in the fourth layer, excluding a portion which overlaps the most extreme end pattern and the first most proximate pattern whose data is converted to the third layer, in a fifth layer;

extracting data of a second most proximate pattern which is most proximate to the non-overlapping pattern whose data is generated in the fifth layer of said each integrated circuit pattern whose data is laid out in the second layer and converting data of the extracted second most proximate pattern from the second layer to the first layer; and repeating from a step of extracting data of the first most proximate pattern from the second layer and converting the data to the third layer to a step of extracting data of the second most proximate pattern from the second layer and converting the data to the first layer with respect to all data of said each integrated circuit pattern.

18. The method according to claim 17, wherein the pattern creation method further comprising:

forming at least a sidewall pattern so as to surround sidewall portions at least one of a plurality of basic patterns which serve as a fundamental for a plurality of the integrated circuit patterns; and processing members located below with the sidewall patterns as a mask, processing the members located below with a space sidewall pattern provided between said each sidewall pattern and said each basic pattern as a mask, or processing members located below with the space sidewall pattern provided adjacent to the sidewall pattern and said each basic pattern used as a mask.

19. The method according to claim 18, further comprising: by the computer:

extracting data of an integrated circuit pattern formed using the sidewall pattern of said each integrated circuit pattern from data of said each integrated circuit pattern and generating data of the sidewall pattern corresponding to the extracted data according to the pattern creation method;

generating data of a cover pattern formed partly into a staircase shape by covering a portion which is formed into a staircase shape extended or contracted as it goes from one side to the other side along a direction of arrangement of the integrated circuit pattern of the sidewall patterns corresponding to the generated data and left on the processing object substrate and the basic pattern which is formed into the staircase shape and surrounded by the portion left on the processing object substrate; and extracting data of plural sides containing each corner portion of the staircase shaped portion of the cover pattern and performing a process for smoothing the corner portions.

20. The method according to claim 17, wherein the smoothing process for the corner portions further comprising: by a computer:

extracting data of plural sides containing each corner portion of the staircase shaped portion of the cover pattern and generating data of any of a triangular pattern which contains two sides adjacent to each other of said each side corresponding to said each extracted data while circumscribing the staircase shaped portion, an isosceles triangle pattern which uses a shorter side of the two sides adjacent to each other as a side while circumscribing the staircase shaped portion and an isosceles triangle pattern which uses a shorter side of the two sides adjacent to each other as a side while inscribing the staircase shaped portion; and adopting any one of a logical sum of data of the triangular pattern which circumscribes the generated staircase shaped portion and data of the cover pattern, a logical sum of data of the isosceles triangle shaped pattern which circumscribes the generated staircase shaped portion and data of the cover pattern and a logical difference of data of the isosceles triangle shaped pattern which inscribes the generated staircase shaped portion and data of the cover pattern.

\* \* \* \* \*